(12) United States Patent
Arakawa

(10) Patent No.: US 8,035,230 B2
(45) Date of Patent: Oct. 11, 2011

(54) SEMICONDUCTOR DEVICE AND METHOD FOR MANUFACTURING SAME

(75) Inventor: Shinichi Arakawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 214 days.

(21) Appl. No.: 11/561,590

(22) Filed: Nov. 20, 2006

(65) Prior Publication Data

US 2008/0142974 A1 Jun. 19, 2008

(30) Foreign Application Priority Data

Nov. 21, 2005 (JP) ................. P2005-335309

(51) Int. Cl.
*H01L 23/52* (2006.01)
(52) U.S. Cl. ........ 257/774; 257/734; 257/750; 257/773; 257/E21.577; 257/E23.145; 257/E23.011; 257/E23.001; 257/E23.151; 257/E23.141; 257/E21.575
(58) Field of Classification Search .......... 257/758, 257/774, E23.144, E23.145, 734, 750, 773, 257/E21.575, E21.577, E23.001, E23.011, 257/E23.141, E23.151
See application file for complete search history.

(56) References Cited

U.S. PATENT DOCUMENTS

| 7,485,915 B2 * | 2/2009 | Nasu et al. .......... 257/310 |
| 2005/0218519 A1 * | 10/2005 | Koike et al. ........ 257/756 |

FOREIGN PATENT DOCUMENTS

| JP | 2005-277390 | 10/2005 |
| JP | 2007-012923 | 1/2007 |

OTHER PUBLICATIONS

T. Usui et al.; Low Resistive and Highly reliable Cu Dual-Damascene Interconnect Technology Using Self-Formed MnSixOy Barrier Layer; Semiconductor Technology Academic Research Center, Oct. 2006.

Z. C. Wu et al.; High Performance 90/65nm BEOL Technology with CVD Porous Low-K Dielectrics (K-2.5) and Low-K ETching Stop (K-3,0); ); )-7803-7873-3/03 2003 IEEE.

Japanese Office Action dated Feb. 26, 2010 for Application No. JP 2005-335309.

* cited by examiner

*Primary Examiner* — David Vu
*Assistant Examiner* — Suberr Chi
(74) *Attorney, Agent, or Firm* — SNR Denton US LLP

(57) ABSTRACT

This invention discloses a semiconductor device including an insulating film having a recess therein; an electric conductor formed inside the recess; a manganese silicate film formed on an upper surface of the conductor, the manganese silicate film being formed of a reaction product of a manganese with a silicon oxide insulating film. A method for manufacturing such a semiconductor device is also described.

1 Claim, 19 Drawing Sheets

F I G . 3
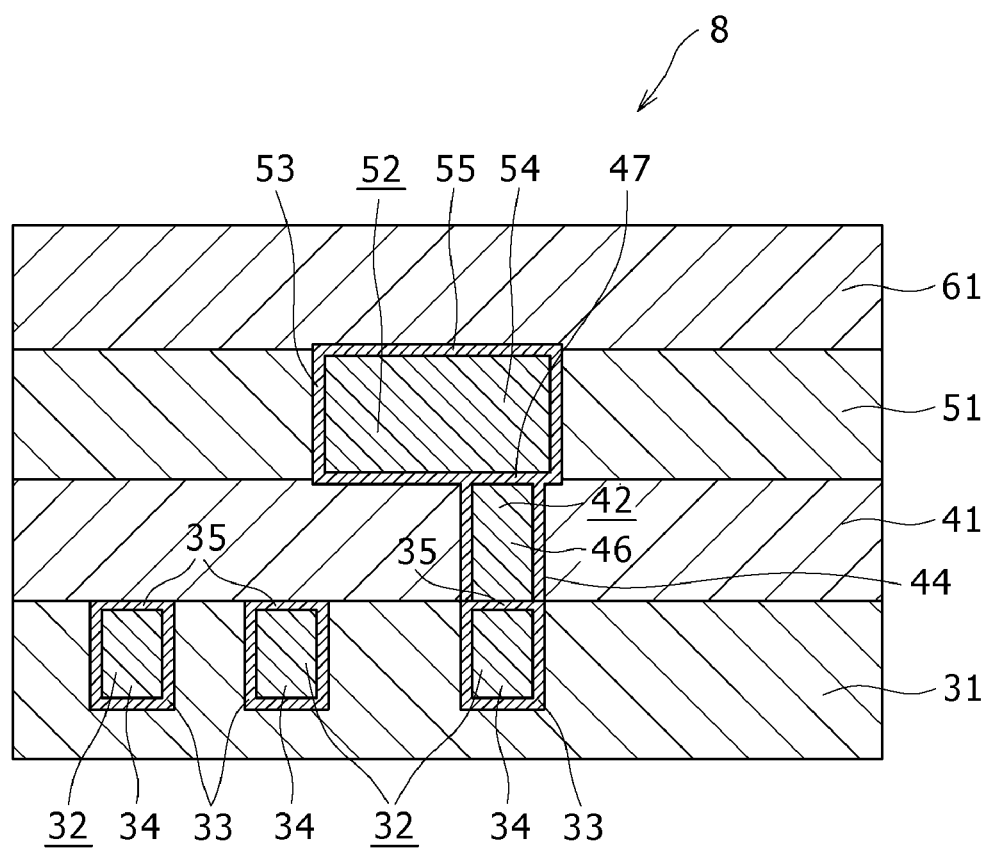

SEMICONDUCTOR DEVICE AND METHOD FOR MANUFACTURING SAME

CROSS REFERENCES TO RELATED APPLICATIONS

The present invention contains subject matter related to Japanese Patent Application JP 2005-335309 filed with the Japanese Patent Office on Nov. 21, 2005, the entire contents of which being incorporated herein by reference.

BACKGROUND OF THE INVENTION

1. Field of the Invention

This invention relates to a semiconductor device which permits easy reduction in interwiring capacitance and also to a method for manufacturing same.

2. Description of the Related Art

In the damascene structure of copper (Cu) wiring, as shown in FIG. 20, a barrier film 213 is formed on the inner surfaces of a wiring recess 212 formed in an oxide film 211 for the purpose of preventing copper from diffusing into the oxide film 211. In general, for the barrier film 213 formed at side walls and a bottom portion of the wiring recess 212, there are frequently used metal materials such as tantalum (Ta), tantalum nitride (TaN), titanium nitride (TiN), tungsten nitride (WN) and the like, and for an insulating film 215 on the upper surface of a copper wiring 214 formed inside the wiring recess 212 through the barrier film 213, silicon insulating film materials are frequently used including materials for chemical vapor deposition such as, for example, silicon nitride (SiN), silicon nitride carbide (SiCN), silicon carbide (SiC), SiCON and the like.

The properties necessary as the barrier film 215 formed on the upper surface of the copper wiring 214 include, aside from the barrier property for suppressing diffusion of copper, a dielectric constant of the barrier film 215 itself, adhesion between the barrier film and interfaces thereof, and processing flexibility of the barrier film 215, which are considered as important parameters for robust process establishment. Especially, with a 65 nm generation and subsequent devices, an influence on working speeds of circuits is occupied largely by wiring units. The barrier film on the upper surface of the copper wiring 214 is required to have such characteristics as mentioned above while lowering the dielectric constant.

For the barrier insulating film suppressing copper diffusion, a difficulty is involved in satisfying such characteristics as mentioned above (e.g. a barrier property for suppressing copper diffusion, adhesion between the barrier film and interfaces thereof, film stress, and processing flexibility and the like) while satisfying a requirement for dielectric constant of 65 nm generation and subsequent devices. An instance of the relationship between the dielectric constant of a barrier insulating film and various characteristics has been introduced in literature (e.g. Z. C. Wu, T. J. Chou, S. H. Lin, Y. L. Huang, C. H. Lin, L. P. Li, B. T. Chen, Y. C. Lu, C. C. Chiang, M. C. Chen, W. Chang, S. M. Jang, and M. S. Liang, "High Performance 90/65 nm BEOL Technology with CVD Porous Low-K Dielectrics (K~2.5) and Low-K Etching Stop (K~3.0)" International Electron Device Meeting Tech. Dig., December 2003, p. 849-852, 2003), and the dielectric constant and various characteristics of the barrier insulating film are in trade-off relation.

A technique of forming a barrier insulating film for copper by so-called self-forming is known using a copper-manganese (CuMn) alloy seed layer as a barrier insulating film for copper (see, for example, T. Usui, H. Nasu, J. Koike, M. Wada, S. Takahashi, N. Shimizu, T. Nishikawa, M. Yoshimura and H. Shibata, "Low resistive and Highly Reliable Cu Dual-Damascene Interconnect Technology Using Self-Formed $MnSi_xO_y$ Barrier Layer", International Interconnect Technology Conference 2005, p. 188-190, 2005).

SUMMARY OF THE INVENTION

A problem to be solved resides in a difficulty in reducing an interwiring capacitance for the reason that the dielectric constant of a material used as a barrier insulating film material on the upper surface of wiring is high.

Accordingly, an embodiment of the present invention provides a semiconductor device wherein an interwiring capacitance can be reduced without formation of a barrier insulating film of high dielectric constant formed on the upper surface of wiring and also a method for manufacturing such a semiconductor device.

The semiconductor device according to an embodiment of the invention includes an insulating film having a recess therein; an electric conductor formed inside the recess; a manganese silicate film formed on an upper surface of the conductor, the manganese silicate film being formed of a reaction product of a manganese with a silicon oxide insulating film.

In the semiconductor device of an embodiment of the invention, the manganese silicate film, which is formed by reaction with the silicon oxide insulating film formed on the electric conductor, is formed on the upper surface of the conductor, so that the formation of a conventionally employed silicon-based barrier insulating film is not necessary. The manganese silicate film is selectively formed only on the upper surface of the conductor without formation on the insulating film.

The method for manufacturing a semiconductor device according to the invention has the steps of providing an insulating film; forming a recess in the insulating film; forming an electric conductor made of a manganese-containing copper film inside the recess; forming a silicon oxide insulating film at least on the first-mentioned insulating film to over the conductor therewith; and forming a manganese silicate layer on an upper surface of the conductor by reaction between manganese present in the conductor and the silicon oxide insulating film.

In the manufacturing method of the semiconductor device according to an embodiment of the invention, because the manganese silicate film formed by reaction with the silicon oxide insulating film formed at least, preferably entirely, on the conductor is formed on an upper surface of the conductor, formation of a conventional silicon-based barrier insulating film of a high dielectric constant is not necessary. The manganese silicate film is formed selectively only on the upper surface of the conductor layer without formation on the insulating film.

The semiconductor device of an embodiment of the invention is advantageous in that the manganese silicate film is selectively formed on the upper surface of the conductor without formation on the insulating film, so that reduction in interwiring capacitance becomes possible. The selective formation of the manganese silicate film only on the upper surface of the conductor without formation on the insulating film is advantageous in that a migration resistance to copper is enhanced, so that wiring reliability against electro-migration, stress migration and the like is improved.

Further, the manufacturing method of the semiconductor device of an embodiment of the invention is advantageous in that the manganese silicate film is selectively formed on the upper surface of the conductor without formation on the insulating film, so that reduction in interwiring capacitance becomes possible. The selective formation of the manganese silicate film only on the upper surface of the conductor without formation on the insulating film is advantageous in that a migration resistance to copper is enhanced, so that wiring reliability against electro-migration, stress migration and the like is improved.

BRIEF DESCRIPTION OF THE DRAWINGS

FIG. 3 is a schematic sectional view showing a semiconductor device according to a third embodiment of the invention;

DETAILED DESCRIPTION OF THE PREFERRED EMBODIMENTS

An instance of a semiconductor device according to a first embodiment of the invention is illustrated with reference to FIG. 1 that is a schematic sectional view of the semiconductor device.

Figure 1:
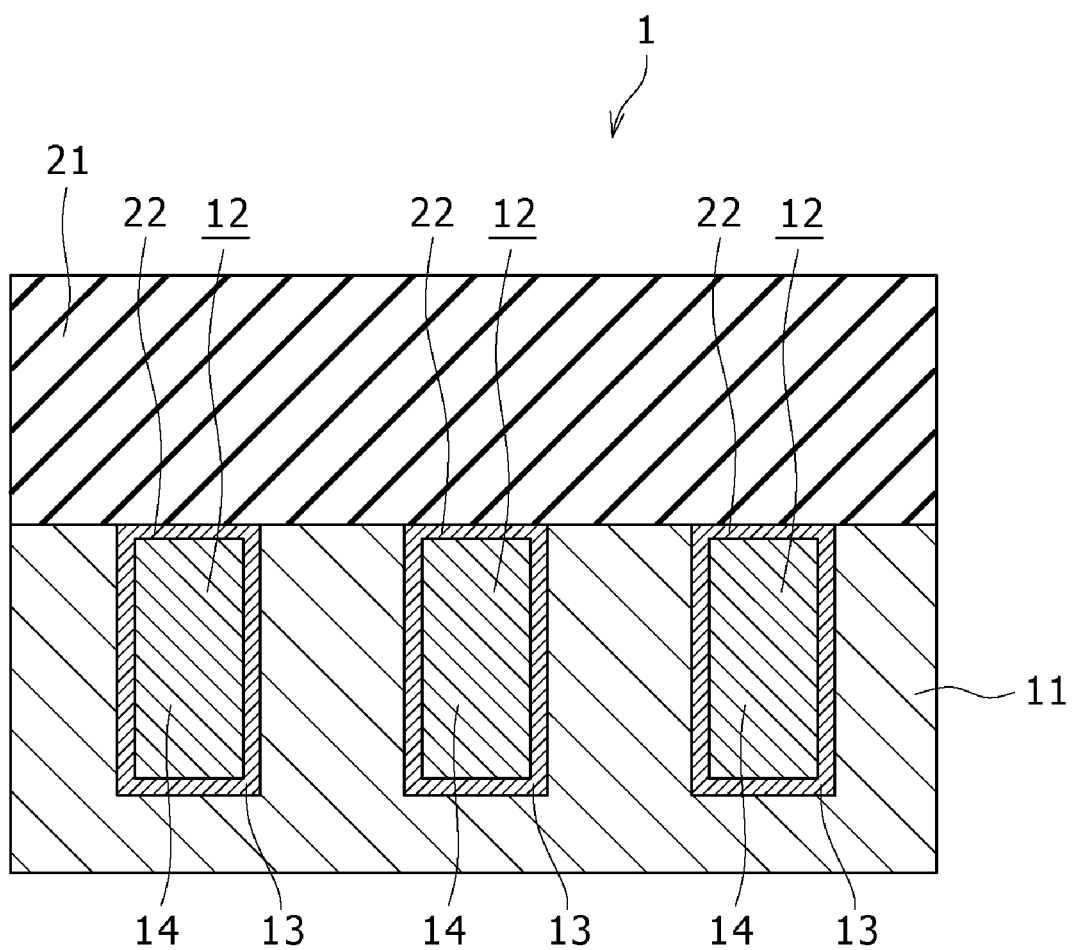
FIG. 1 is a schematic sectional view showing a semiconductor device according to a first embodiment of the invention.

As shown in FIG. 1, a recess 12 is formed in an insulating film 11. This recess 12 is, for example, a wiring recess, or a connection hole connecting an upper layer wiring and a lower layer wiring, or a connection hole formed at the wiring recess and also at the bottom of the wiring recess. The wiring recess is illustrated herein for an instance of the recess 12. An electric conductor (e.g. a wiring) 14 is formed inside the recess 12 via a barrier layer 13. The barrier film 13 is formed, for example, of a tantalum (Ta) film. The conductor 14 is formed of a copper material, such as copper or a copper alloy made mainly of copper, which is able to contain manganese. A silicon oxide insulating film 21 is formed on the insulating film 11 to cover the conductor 14 therewith. The conductor 14 is formed, at the upper surface thereof, with a manganese silicate ($MnSi_xO_y$) film 22, which is formed by reaction between manganese (Mn) present in the conductor 14 and silicon (Si) and oxygen (O) of the silicon oxide insulating film 21. x and y in the formula are appropriately determined in consideration of a barrier property against copper.

The insulating film 11 may be formed of a silicon oxide insulating film, and the barrier film 13 may be formed of a manganese silicate ($MnSi_xO_y$) film. In this case, x and y are appropriately determined in consideration of a barrier property against copper. When, for example, the insulating film 11 is formed of a silicon oxide insulating film, this manganese silicate film is formed by reaction between manganese (Mn), for example, of a copper manganese alloy layer (not shown) formed on inner surfaces of the recess 12 prior to the formation of the conductor 14 inside the recess 12 and silicon (Si) and oxygen (O) of the silicon oxide insulating film.

In this way, where the barrier film 13 is made of a manganese silicate film, the barrier film 13 and the manganese silicate film 22 can be formed of the same type of material as contiguously connected in the form of a manganese silicate film. This permits the conductor 14 to be covered or enfolded with the barrier film 13 and the manganese silicate film 22.

With the semiconductor device 1 having such an arrangement as set out above, since the manganese silicate film 22 formed by reaction with the silicon oxide insulating film 21 is formed on the upper surface of the conductor 14, the formation of a conventional silicon-based barrier insulating film is not needed, with the attendant advantage that the interwiring capacitance can be reduced. Moreover, the manganese silicate film 22 is formed selectively only on the upper surface of the conductor 14 without formation on the insulating film 11, thereby permitting the interwiring capacitance to be conveniently reduced. With the case where the barrier film 13 made of a manganese silicate film is formed at the boundary between the inner surface of the recess 12 and the conductor 14, the conductor 14 is wholly covered with the barrier film 13 made of a manganese silicate film and the manganese silicate film 22, with the advantage that a migration resistance to copper is enhanced and wiring reliability against electromigration, stress migration and the like is improved.

Next, a semiconductor device according to a second embodiment of the invention is illustrated with reference to FIG. 2 that is a schematic sectional view of the device. In the second embodiment, the recess 12 is constituted of a wiring recess and a connection hole, and a manganese silicate film is formed on wiring.

Figure 2:
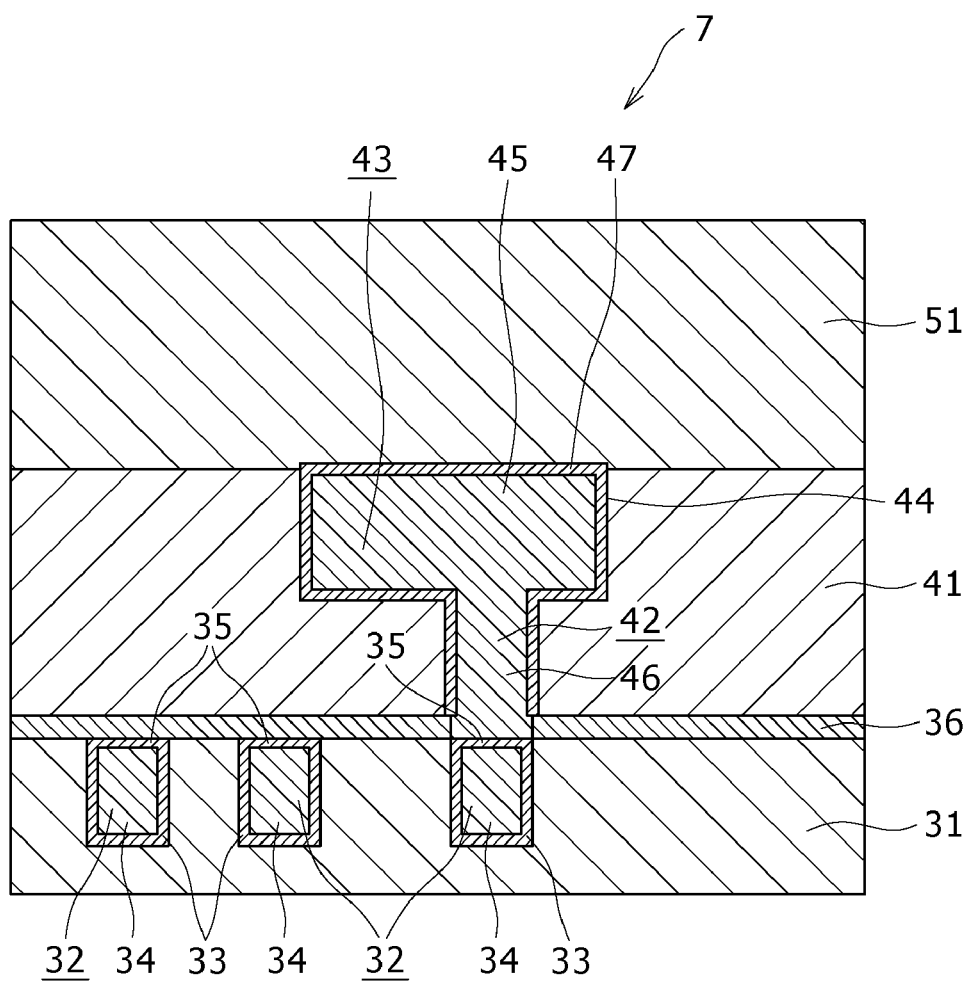
FIG. 2 is a schematic sectional view showing a semiconductor device according to a second embodiment of the invention.

As shown in FIG. 2, a first insulating film 31 made, for example, of a silicon oxide insulating film is formed on a semiconductor substrate (not shown). This first insulating film 31 is formed, for example, of an inorganic oxide film, e.g. a MSQ (methyl silsesquioxane) film, having a dielectric constant of 3 or below in a thickness of 200 nm. The first insulating film 31 is formed therein with a recess 32 (hereinafter illustrated as a wiring recess), for example, in a thickness of 150 nm. The wiring recess 32 has thereinside a conductor 34 (hereinafter referred to as a first wiring) made of a copper film via a barrier film 33 made of a manganese silicate ($MnSi_xO_y$) film.

A thin manganese silicate ($MnSi_xO_y$) film 35 having a high barrier property against copper is formed on the upper surface of the first wiring 34 by reaction between manganese (Mn) diffused in the first wiring 34 and silicon (Si) and oxygen (O) present in a silicon oxide insulating film (not shown) formed on the upper surface of the first wiring 34. More particularly, the manganese silicate film 25 is formed selectively only on the first wiring 34 serving as a copper wiring. It will be noted that the silicon oxide insulating film is removed.

A barrier film 36 is formed over the first insulating film 31 so as to cover the first wiring 34 therewith. This barrier film 36 is formed, for example, of a silicon nitride carbide (SiCN) film, for example, in a thickness of 30 nm. A second insulating film 41 is formed on the barrier film 36. The second insulating film 41 is formed by deposition, for example, of MSQ (methyl silsesquioxane) in a thickness of 250 nm.

A via hole 42 that arrives at the first wiring 34 through the barrier film 36 is formed in the second insulating film 41. Moreover, a wiring recess 43 is formed in the second insulating film 41 above the via hole 42. More particularly, the via hole 42 is formed at the bottom of the wiring recess 43. Inside the wiring recess 43 and the via hole 42, a second wiring 45 made of a conductor and a connection plug 46 are, respectively, formed via a barrier film 44 made of a manganese silicate ($MnSi_xO_y$) film of a high barrier property against copper which is formed by reaction between manganese (Mn) present in a seed film (not shown) and silicon (Si) and oxygen (O) in the second insulating film 41 made of a silicon oxide insulating film. The barrier film 44 is formed, by so-called self-forming, on the side walls and bottom surface of the wiring recess 43 and the side walls of the via hole 42.

A third insulating film 51 made of a silicon oxide insulating film is formed on the second insulating film 41 so as to cover the second wiring 45 therewith. This silicon oxide insulating film is formed, for example, by deposition of MSQ (methyl silsesquioxane) in a thickness of 250 nm.

Further, a manganese silicate ($MnSi_xO_y$) thin film 47 of a high barrier property against copper, which is formed by reaction between manganese diffused in the second wiring 45 and silicon (Si) and oxygen (O) present in the third insulating film 51 made of a silicon oxide insulating film, is formed between the second wiring 45 and the third insulating film 51. This manganese silicate film 47 is formed selectively only on the second wiring 45 made of a copper material.

With the semiconductor device 7 having such an arrangement as set out above, since the manganese silicate films 35, 47, which are formed by reaction with the silicon oxide insulating film, are, respectively, on the first wiring 34 and the second wiring 45, the formation of a conventional silicon-based barrier insulating film is not needed, with the advantage that the interwiring capacitance can be reduced. Moreover, because of the selective formation of the manganese silicate films 35, 47 only on the upper surfaces of the first wiring 34 and the second wiring 45 without formation of on the first insulating film 31 and the second insulating film 41, the interwiring capacitance can be advantageously reduced. Because the first wiring 34 is enfolded with the barrier film 33 and the manganese silicate film 35 and the second wiring 45 and connection plug 46 are, respectively, enfolded with the barrier film 44 and the manganese silicate film 47, the migration resistance to copper is enhanced and wiring reliability against electromigration, stress migration and the like is improved.

Next, a semiconductor device according to a third embodiment of the invention is illustrated with reference to FIG. 3 that is a schematic sectional view of the device. The device of this embodiment is one wherein the recess 13 is constituted of a wiring recess and a connection hole and a manganese silicate film is formed on both of the wiring and connection plug.

As shown in FIG. 3, a first insulating film 31 made, for example, of a silicon oxide insulating film is formed on a semiconductor substrate (not shown). This first insulating film 31 is formed, for example, of an inorganic oxide film, e.g. MSQ (methyl silsesquioxane) film, having a dielectric constant of 3 or below in a thickness of 200 nm. The first insulating film 31 is formed therein with a recess 32 (hereinafter referred to as a wiring recess), for example, at a depth of 150 nm. An electric conductor 34 (hereinafter referred to as a first wiring) made of a copper-based film is formed inside the wiring recess 32 via a barrier film 33 made of a manganese silicate ($MnSi_xO_y$) film.

A manganese silicate ($MnSi_xO_y$) film 35 of a high barrier property against copper, which is formed by reaction between manganese (Mn) diffused in the first wiring 34 and silicon (Si) and oxygen (O) present in a second insulating film 41 formed on the upper surface of the first wiring 34 and made of a silicon oxide insulating film, is formed on the upper surface of the first wiring 34. More particularly, the manganese silicate film 35 is formed selectively on the first wiring 34 that is a copper-based wiring.

The second insulating film 41 is formed on the first insulating film 31 so as to cover the first wiring 34 therewith. This silicon oxide insulating film is formed by deposition, for example, of MSQ (methyl silsesquioxane) in a thickness of 100 nm.

The second insulating film 41 is formed therein with a recess 42 (hereinafter referred to as via hole) arriving at the first wiring 34. An electric conductor 46 (hereinafter referred to as connection plug) made of a copper-based film is formed inside the via hole 42 via a barrier film 44 made of a manganese silicate (($MnSi_xO_y$) film.

A manganese silicate thin film 47, which is formed by reaction between manganese (Mn) diffused in the connection plug 46 and silicon (Si) and oxygen (O) present in a third insulating film 51 formed on the upper surface of the connection plug 46 and made of a silicon oxide insulating film, is formed on the upper surface of the connection plug 46. More particularly, the manganese silicate film 47 is formed selectively on the connection plug 46.

The third insulating film 51 is formed on the second insulating film 41 so as to cover the connection plug 46 therewith. This silicon oxide insulating film is formed, for example, by deposition of MSQ (methyl seilsesquioxane) in a thickness of 150 nm.

The third insulating film 51 is formed with a recess 52 (hereinafter referred to as a wiring recess) therein. A conductor 54 (hereinafter referred to as a second wiring) is formed inside the wiring recess 52 via a barrier film 53 made of a manganese silicate ($MnSi_xO_y$) film.

A manganese silicate ($MnSi_xO_y$) film 55 of a high barrier property against copper, which is formed by reaction between manganese (Mn) diffused in the second wiring 54 and silicon (Si) and oxygen (O) present in a fourth insulating film 61 formed on the upper surface of the second wiring 54 and made of a silicon oxide insulating film, is formed on the upper surface of the second wiring 54. More particularly, the manganese silicate film 55 is formed selectively on the second wiring 54 that is a copper-based wiring.

With a semiconductor device 8 having such an arrangement as set out hereinabove, since the manganese silicate films 35, 55, which are each formed by reaction with the silicon oxide insulating film, are, respectively, formed on the upper surfaces of the first wiring 34 and the second wiring 54. The formation of a conventional silicon-based barrier insulating film is not needed, with the advantage that the interwiring capacitance can be reduced. Moreover, the manganese silicate films 35, 55 are, respectively, formed selectively on the upper surfaces of the first wiring 34 and the second wiring 54 without formation on the first insulating film 31 and the third insulating film 51, thereby permitting the interwiring capacitance to be advantageously reduced. In addition, the first wiring 34 is enfolded with the barrier film 33 and the manganese silicate film 47, the connection plug 46 is enfolded with the barrier film 44 and the manganese silicate 47, and the second wiring 54 is enfolded with the barrier film 53 and the manganese silicate film 55, so that a migration resistance to copper is enhanced and wiring reliability against electro migration, stress migration and the like can be improved.

Next, a method for manufacturing a semiconductor device according to a fourth embodiment of the invention is illustrated with reference to FIGS. 4A to 4C.

Figure 4A:
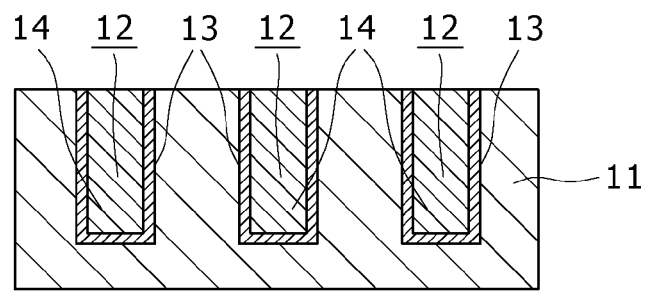
FIGS. 4A to 4C are schematic sectional views showing a method for manufacturing a semiconductor device according to a fourth embodiment of the invention.

As shown in FIG. 4A, a recess 12 is formed in an insulating film 11. This insulating film 11 is formed, for example, of a silicon oxide insulating film. The recess 12 is, for example, a wiring recess or a connection hole connecting an upper layer wiring and a lower layer wiring, or may be a connection hole formed at a wiring recess and the bottom of the wiring recess. For an instance, the recess is illustrated as a wiring recess herein.

The recess 12 is formed in the insulating film 11 by forming a resist mask (not shown) by ordinary resist coating and a lithographic technique and dry etching by use of the resist mask. Thereafter, the resist mask is removed.

Next, a copper-manganese alloy layer is formed on the inner surfaces of the recess 12, followed by burying with a copper film and thermal treatment to form a barrier film 13 made of a manganese silicate film between the insulating film 11 and the copper film. An excess copper film and barrier film 13 on the insulating film 11 are removed to form a conductor 14 (e.g. a wiring) made of the copper film through the barrier film 13 made of the manganese silicate film in the inside of the recess 12. At this stage, excess manganese is diffused into the copper film.

Figure 4B:
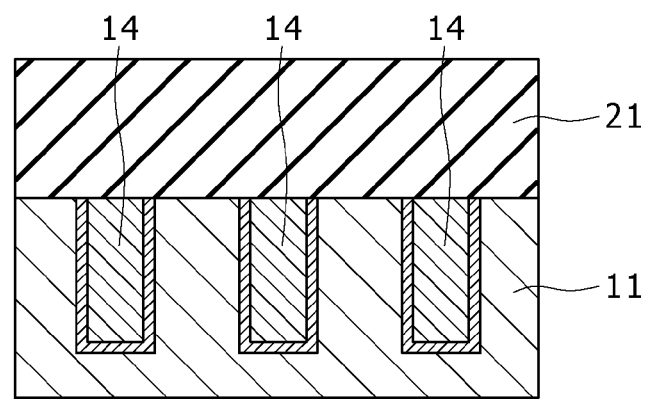

Next, as shown in FIG. 4B, a silicon oxide insulating film 21 is formed on the insulating film 11 so as to cover the conductor 14 therewith. This silicon oxide insulating film 21 may be one whose main component is, for example, silicon oxide ($SiO_2$). For an instance, a MSQ (methyl silsesquioxane) film is used herein.

Figure 4C:
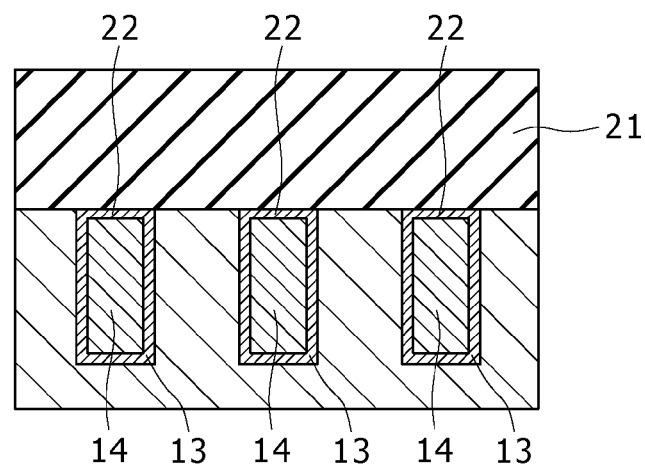

Thereafter, as shown in FIG. 4C, the manganese in the conductor 14 and silicon (Si) and oxygen (O) in the silicon oxide insulating film are reacted by thermal treatment to form a manganese silicate ($MnSi_xO_y$) film 22 at an interface between the insulating film 11 and the conductor 14. x and y in the formula are appropriately determined in consideration of a barrier property against copper.

The barrier film 13 made of the manganese silicate film and the manganese silicate film 22 are formed as contiguously connected with each other. Thus, the conductor 14 is in a condition where enfolded with the barrier film 13 made of a manganese silicate film and the manganese silicate film 22.

In the manufacturing method of the semiconductor device, the manganese silicate film 22, formed by reaction with the silicon oxide insulating film 21 formed on the conductor 14, is formed, so that it is not necessary to form a conventional silicon-based barrier insulating film of a high dielectric constant. The manganese silicate film 22 is formed selectively on the upper surface of the conductor without formation on the insulating film 11, thus leading to the advantage that the interwiring capacitance can be reduced. The selective formation of the manganese silicate film 22 only on the upper surface of the conductor 14 without formation on the insulating film 11 permits the conductor 14 to be enfolded with the barrier film 13 made of a manganese silicate film and the manganese silicate film 22. Hence, a migration resistance to copper is enhanced, and wiring reliability against electromigration, stress migration and the like is improved.

Next, a method for manufacturing a semiconductor device according to a fifth embodiment of the invention is described with reference to FIGS. 5A to 6B that are, respectively, a schematic sectional view showing a manufacturing step.

Figure 5A:
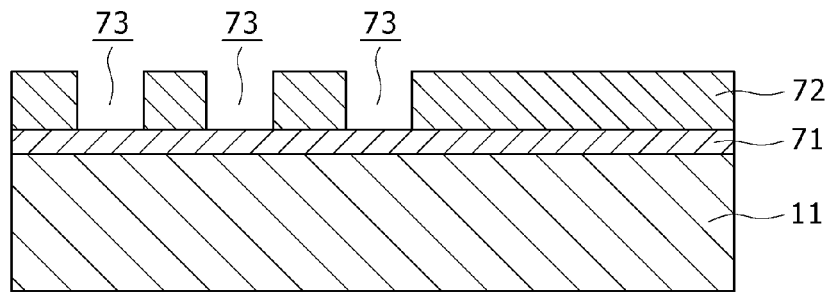
FIGS. 5A to 5D are schematic sectional views showing a method for manufacturing a semiconductor device according to a fifth embodiment according to the invention.

As shown in FIG. 5A, an insulating film 11 formed on a semiconductor substrate (not shown). This insulating film 11 is formed of an inorganic oxide film, e.g. a MSQ (methyl silsesquioxane) film, having a dielectric constant of 3 or below. The thickness is, for example, at 200 nm. An organic anti-reflective film 71 (BARC: bottom anti-reflective coat) is formed on the insulating film, and an etching mask 72 for forming a recess 12 (e.g. a wiring recess) is formed using, for example, a chemically amplified ArF resist. This etching mask 72 is formed, for example, with a recess pattern 73 having a line width of 60 nm.

Figure 5B:
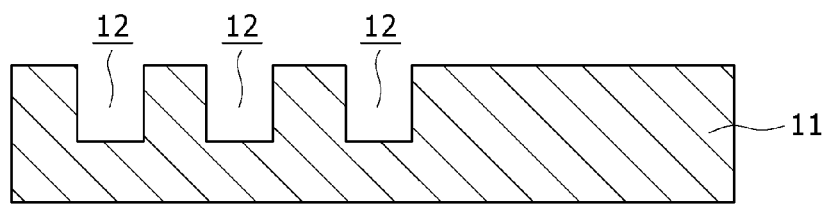

Next, as shown in FIG. 5B, using the etching mask 72 (see FIG. 5A), the insulating film 11 is processed to form a recess (a wiring recess) 12 as an extension of the recess pattern 53 (see FIG. 5B). For the etching, a carbon fluoride-based (CF) etching gas is used, for example, to form the recess 12 having a depth, for example, of 150 nm. Thereafter, the etching mask 72 left after the etching and the organic anti-reflective film 71 are peeled off, for example, by oxygen ($O_2$) gas ashing.

Figure 5C:
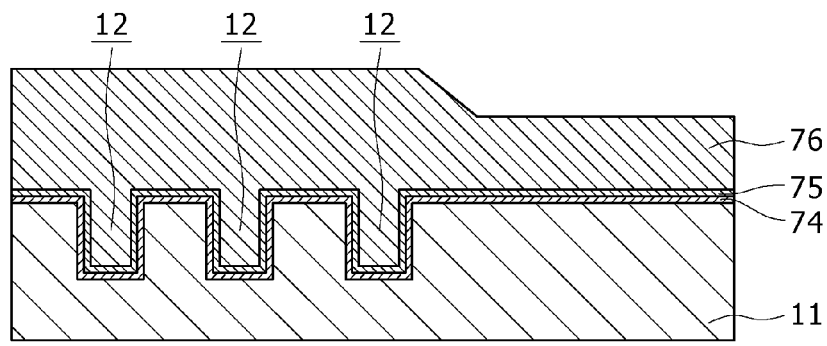

Next, as shown in FIG. 5C, a barrier metal film 74 is formed on the inner surfaces of the recess 12 and the surface of the insulating film 11. This barrier metal film 74 is made, for example, of tantalum (Ta) and the thickness thereof is, for example, at 5 nm. A seed film 75 is further formed. The seed film 75 is made, for example, of a copper-manganese (CuMn) alloy film containing 2 wt % of manganese (Mn) and is formed in a thickness, for example, of 40 nm. These barrier metal film 74 and seed film 75 can be, respectively, formed by a thin film formation technique such as a sputtering method, an atomic layer deposition technique or the like. Moreover, a copper-based film 76 is formed by an electrolytic plating (ECP) method or a CVD method so as to bury the recess 12 therewith. A copper film is formed herein.

Figure 5D:
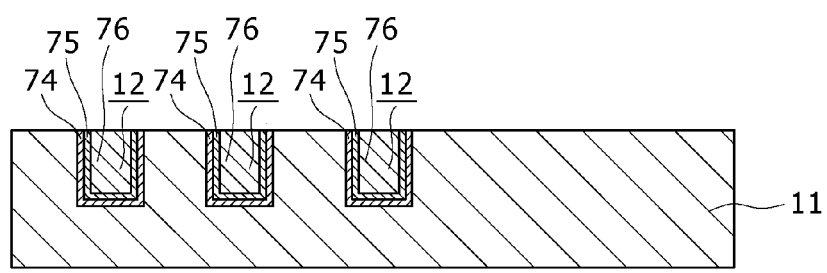

Subsequently, as shown in FIG. 5D, an excess copper-based film 76 (see FIG. 5C), seed film 75, barrier metal film 74 and the like are polished from the surface of the insulating film 11 by a chemical mechanical polishing (CMP) method to expose the surface of the insulating film 11 and also to form, within the recess 12, a conductor (e.g. wiring) 14 made of the copper film 76 via the barrier metal film 74 and the seed film 75.

Figure 6A:
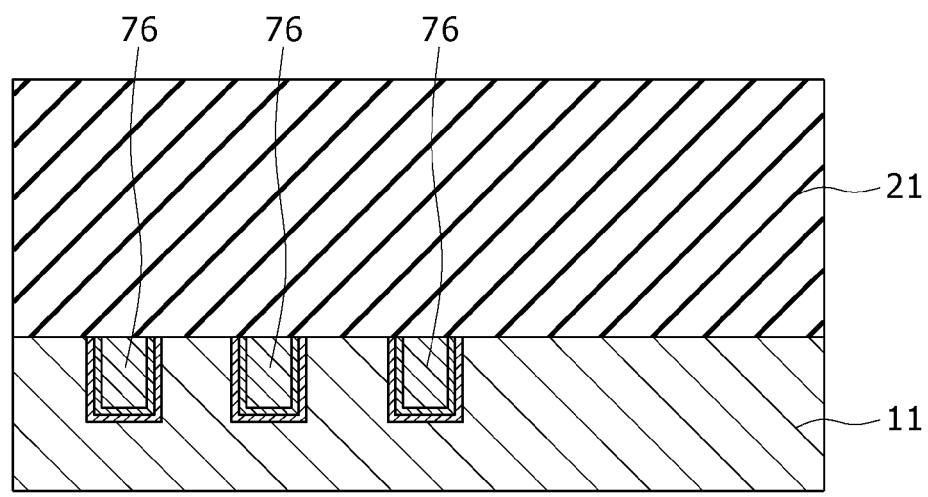
FIGS. 6A and 6B are schematic sectional views showing a method for manufacturing a semiconductor device according to a fifth embodiment of the invention.

Next, as shown in FIG. 6A, a silicon oxide insulating film 21 is formed on the insulating film 11 so as to cover the copper film 76. This silicon oxide insulating film 21 is formed by deposition, for example, of MSQ (methyl silsesquioxane) in a thickness of 250 nm.

Figure 6B:
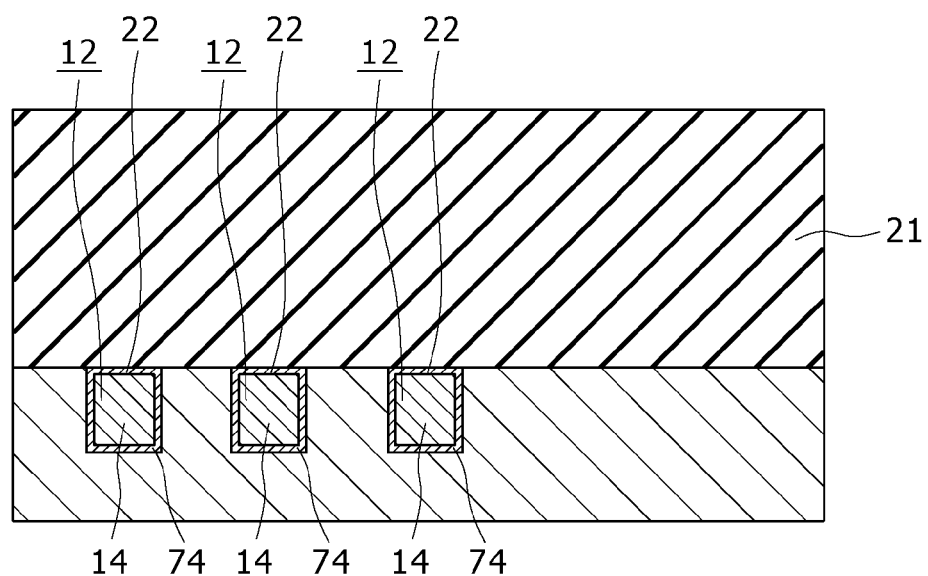

Thereafter, as shown in FIG. 6B, thermal treatment is carried out. This thermal treatment is performed, for example, at a heating temperature of 300° C. for 60 minutes. According to the treatment, manganese (Mn) present in the seed film 75 (see FIG. 5D) is diffused to the surface portion of the copper film 76 (see FIG. 5D). This manganese (Mn) reacts with silicon (Si) and oxygen (O) in the silicon oxide insulating film 21 to form a manganese silicate ($MnSi_xO_y$) layer of a high barrier property against copper in the form of a thin film. In other words, the manganese silicate film 22 having a good barrier property against copper is formed selectively only on the conductor 14 made of the copper film 76. It will be noted that owing to the thermal budget involved in the CVD film formation of the silicon oxide insulating film 21, the above-mentioned thermal treatment for forming the manganese silicate film that is a self-formed barrier film is not always essential, but is preferred in order to enhance the formation efficiency of the manganese silicate film. Manganese present in the seed film 75 is used upon formation of the manganese silicate film 22 and thus, the seed film 75 becomes a copper film, resulting in part of the conductor 14. Accordingly, the conductor 14 is formed inside the recess 12 via the barrier film 74 and the manganese silicate film 22 is formed on the upper surface of the conductor 14.

In the manufacturing method of the semiconductor device, there is no need of forming a silicon nitride carbide (SiCN) insulating film having a dielectric constant of about 5 and formed on wiring in existing techniques. As a result, the capacitance could be reduced by 10% over that of prior art. Moreover, because interface adhesion between the conductor 14 and the manganese silicate film 22 is improved, resistances of stress migration (SM), electro migration (EM) and the like are improved, thereby improving wiring reliability.

In the manufacturing method of the semiconductor device, a so-called single damascene structure has been illustrated, and the method of the invention may be likewise applied to a dual damascene structure. For the materials constituting the conductor 14, not only copper films formed of copper, a copper alloy and the like, but also metals such as silver (Ag), gold (Au), aluminium (Al) and the like may be usable.

A method for manufacturing a semiconductor device according to a sixth embodiment of the invention is now described with reference to FIGS. 7A to 8 that are, respectively, a sectional view showing a manufacturing step.

Figure 7A:
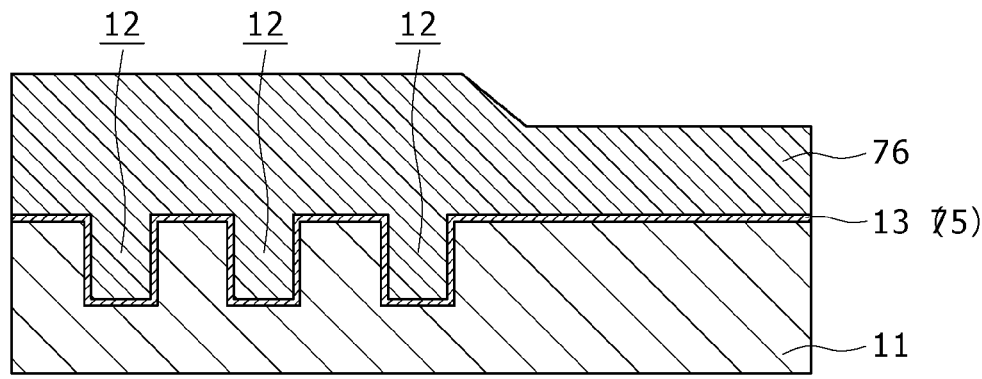
FIGS. 7A to 7C are schematic sectional views showing a method for manufacturing a semiconductor device according to a sixth embodiment of the invention.

As shown in FIG. 7A, like the fifth embodiment illustrated with reference to FIGS. 5A and 5B, a silicon oxide insulating film is formed as an insulating film 11 on a semiconductor substrate (not shown). This insulating film 11 is formed of an inorganic oxide film having a dielectric constant of 3 or below, e.g. a MSQ (methyl silsesquioxane) film. The thickness is, for example, at 200 nm. Moreover, a recess 12 (e.g. a wiring recess) is formed in the insulating film 11 by etching. For the etching, a carbon fluoride (CF) etching gas is used, and the recess 12 is formed at a depth, for example, of 150 nm.

Next, a seed film 75 is formed on the inner surfaces of the recess 12 and the surface of the insulating film 11. This seed film 75 is made, for example, a copper-manganese (CuMn) alloy film in a thickness, for example, of 40 nm. The seed film 75 can be formed by a thin film formation technique such as a sputtering method, an atomic layer deposition method or the like. Moreover, a copper-based film 76 is formed by an electrolytic plating (ECP) method or a CVD method so as to bury the recess 12 therewith. A copper film is formed herein.

Next, thermal treatment is carried out. The thermal treatment is performed, for example, at a heating temperature of 300° C. for 60 minutes. This treatment permits grain growth of copper in the copper-based film 76 to be promoted and causes the reaction between manganese (Mn) in the seed film 75 and silicon (Si) and oxygen (O) present in the insulating film 11 made of a silicon oxide insulating film, thereby forming a barrier film 13 of a high barrier property against copper made of manganese silicate ($MnSi_xO_y$) thin film. In this way, the barrier film 13 is formed, by so-called self-forming, on the side walls and the bottom surface of the recess 12.

Figure 7B:
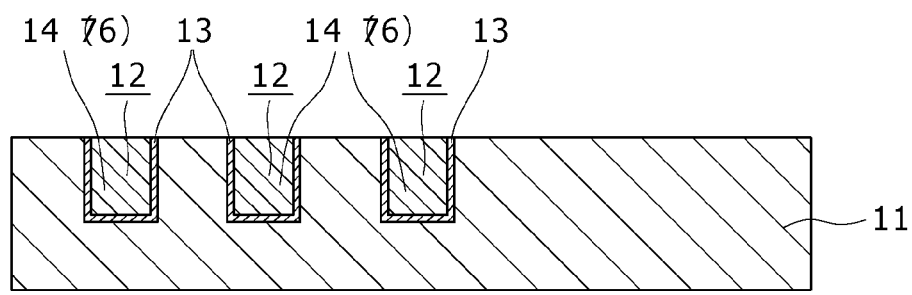

Next, as shown in FIG. 7B, a copper-based film 76 (see FIG. 7A), barrier film 13 (see FIG. 7A) and seed film 75 (see FIG. 7A), each in excess on the surface of the insulating film 11, are polished by a chemical mechanical polishing (CMP) method at unreacted portions thereof to expose the surface of the insulating film 11 and also to form a conductor 14 (wiring), made of the copper-based film 76, inside the recess 12 via the barrier film 13 made of manganese silicate. For the formation of the manganese silicate film, the manganese present in the seed film 75 made of a copper-manganese alloy is not consumed to a full extent and thus, manganese is left therein. This manganese is diffused in the conductor 14.

Figure 7C:
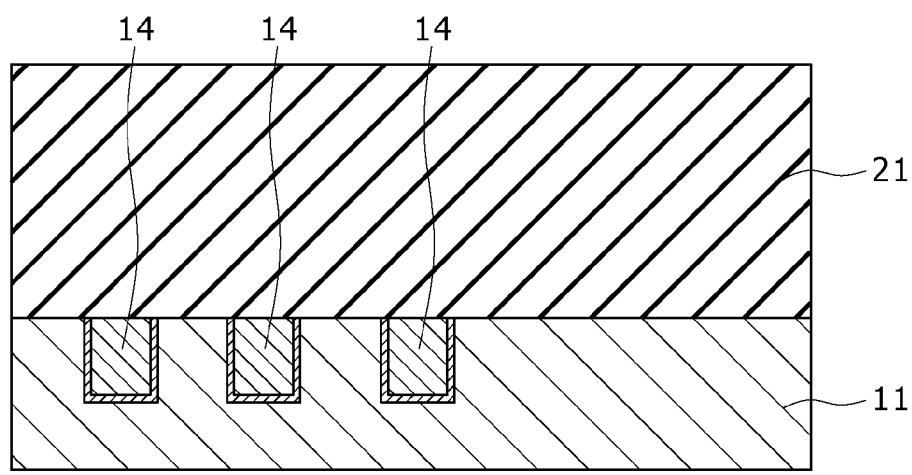

Next, as shown in FIG. 7C, a silicon oxide insulating film 21 is formed on the insulating film 11 so as to cover the conductor 14 therewith. The silicon oxide insulating film 21 is formed, by example, by deposition of MSQ (methyl silsesquioxane) in a thickness of 250 nm.

Figure 8:
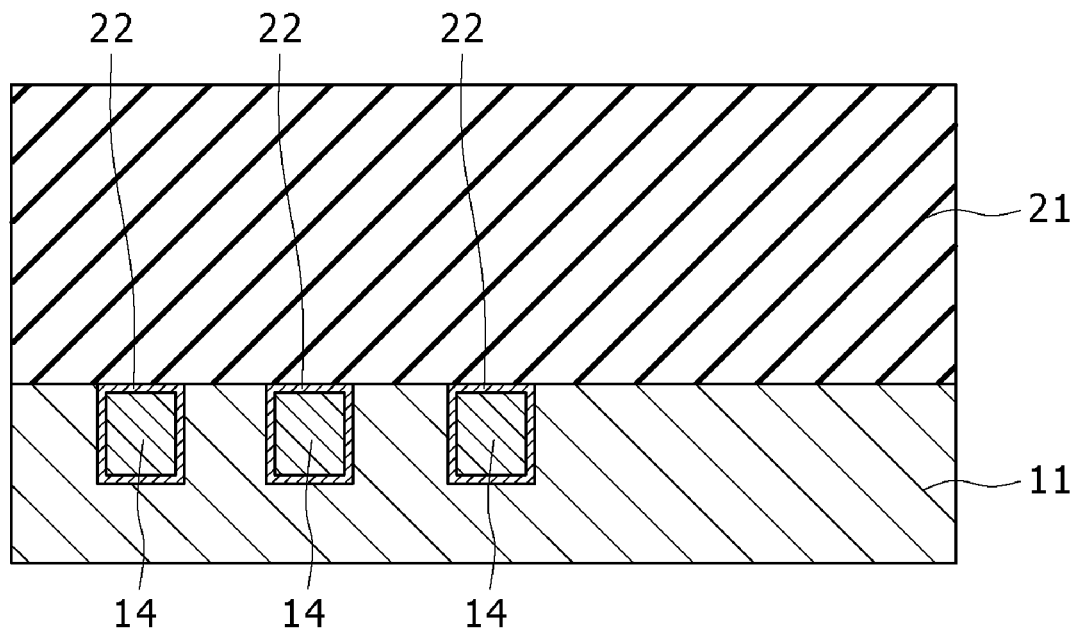
FIG. 8 is a schematic sectional view showing a method for manufacturing a semiconductor device according to a sixth embodiment of the invention.

Thereafter, as shown in FIG. 8, thermal treatment is carried out. The thermal treatment is performed, for example, at a heating temperature of 300° C. for 60 minutes. This treatment permits manganese (Mn) diffused in the conductor 14 to be further diffused up to the surface portion of the conductor 14, and this manganese (Mn) reacts with silicon (Si) and oxygen (O) present in the silicon oxide insulating film 21, thereby forming a manganese silicate ($MnSi_xO_y$) thin film 22 of a high barrier property against copper. More particularly, the manganese silicate film 22 is formed selectively only on the conductor 14 serving as a copper wiring. It will be noted that owing to the thermal budget involved in the CVD film formation of the silicon oxide insulating film 21, the above-mentioned thermal treatment for forming the manganese silicate film that is a self-formed barrier film is not always essential but is preferred for enhancing a formation efficiency of the manganese silicate film 22.

In the manufacturing method of the semiconductor device, there is no need of forming a silicon nitride carbide (SiCN) insulating film having a dielectric constant of about 5 on wiring as having been formed in existing techniques, so that the capacitance could be reduced over the case of prior art, like the fifth embodiment relating to the manufacturing method. Moreover, because interface adhesion between the conductor 14 and the manganese silicate film 22 is improved, resistances to stress migration (SM), electro migration (EM) and the like are improved, thereby improving wiring reliability.

In the manufacturing method of the semiconductor device, the so-called single damascene structure has been illustrated, and the method of the invention may be likewise applied to a dual damascene structure. For the materials constituting the conductor 14, not only copper films formed of copper, a copper alloy and the like, but also metals such as silver (Ag), gold (Au), aluminium (Al) and the like may be usable.

Next, a method for manufacturing a semiconductor device according to a seventh embodiment of the invention is illustrated with reference to FIGS. 9A to 9C that are, respectively a schematic sectional view showing a manufacturing step.

Figure 9A:
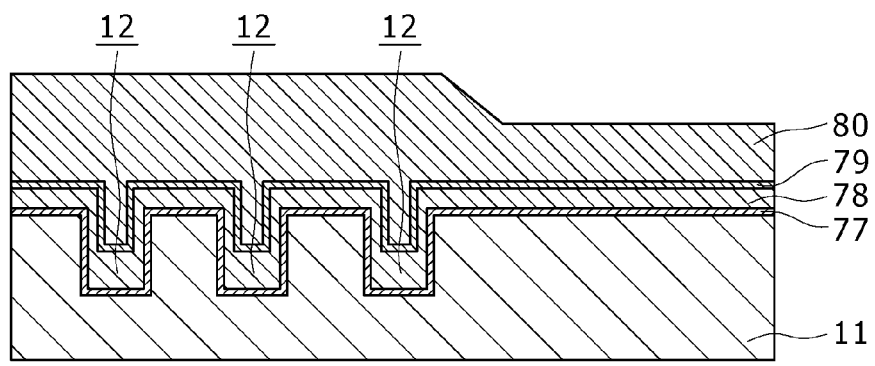
FIGS. 9A to 9C are schematic sectional views showing a method for manufacturing a semiconductor device according to a seventh embodiment of the invention.

As shown in FIG. 9A, an insulating film 11 made of a silicon oxide insulating film is formed on a semiconductor substrate (not shown) in the same manner as in the fifth embodiment illustrated with reference to FIGS. 5A and 5B. This insulating film is formed, for example, of an inorganic oxide film, e.g. a MSQ (methyl silsesquioxane) film, having a dielectric constant of 3 or below, for example, by a chemical vapor deposition (CVD) method. The film thickness is, for example, at 200 mm. The insulating film 11 is etched to form the recess 12 (e.g. a wiring recess). For the etching, a carbon fluoride (CF) etching gas is used, for example, with the recess 12 being formed in a depth, for example, of 150 nm.

Next, a first seed film 77 is formed on the inner surfaces of the recess 12 and the surface of the insulating film 11. The first seed film 77 is made, for example, of a copper-manganese (CuMn) alloy film and is formed in a thickness, for example, of 40 nm. This first seed film 77 can be formed according to a thin film formation technique such as a sputtering method, an atomic layer deposition method or the like. Moreover, a first copper film 78 is formed by an electrolytic plating (ECP) method or a CVD method. For this, a copper film having a thickness, for example, of 50 nm is formed herein.

Subsequently, a second seed film 79 is formed on the surface of the first copper film 78. This second seed film 79 is made, for example, of a copper-manganese (CuMg) alloy film with its thickness being, for example, at 10 nm. The second seed film 79 can be formed by a thin film formation technique such as a sputtering method, an atomic layer deposition method or the like. A second copper-based film 80 is formed by an electroplating (ECP) method or a CVD method as burying the recess 12 therewith. For the film 80, a copper film is used herein. It will be noted that the thicknesses of the seed films 77, 79 and the copper-based films 78, 80 may be so controlled to provide, inside the recess 12, a multi-layered structure having layers larger in number than those mentioned above.

Next, thermal treatment is carried out. The thermal treatment is performed, for example, at a heating temperature of 300° C. for 60 minutes. This treatment permits grain growth of copper in the first and second copper-based films 78, 80 to be promoted and causes the reaction between manganese (Mn) in the first and second seed films 78, 80 and silicon (Si) and oxygen (O) present in the insulating film 11 made of a silicon oxide insulating film, thereby forming a barrier film (not shown) of a high barrier property against copper made of a manganese silicate ($MnSi_xO_y$) thin film. In this way, the barrier film 13 is self-formed on the side walls and the bottom surface of the recess 12.

Figure 9B:
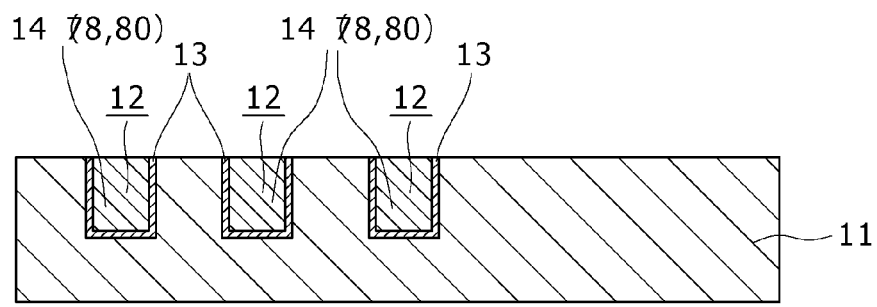

Next, as shown in FIG. 9B, the unreacted portions of the first and second copper-based films 78, 80 (see FIG. 9A) and first and second seed films 77, 79 (see FIG. 9A), and the barrier film 13, each in excess on the surface of the insulating film 11, are polished by a chemical mechanical polishing (CMP) method to expose the surface of the insulating film 11 and also to form a conductor 14 (wiring), made of the copper-based films 78, 80, inside the recess 12 via the barrier film 13 made of manganese silicate. For the formation of the manganese silicate film, the manganese present in the first and second seed films 77, 79 made of a copper-manganese alloy is not consumed to a full extent and thus, manganese is left therein. This manganese is diffused into the conductor 14.

Figure 9C:
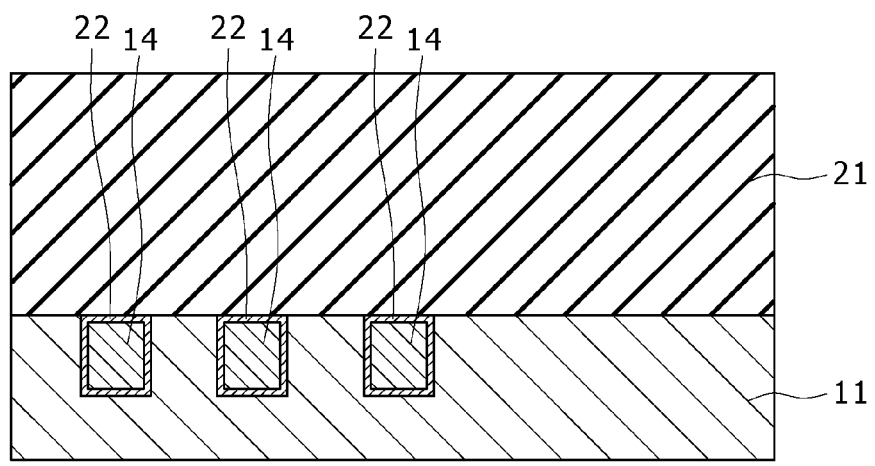

As shown in FIG. 9C, a silicon oxide insulating film 21 is formed on the insulating film 11 so as to cover the conductor 14 therewith. This silicon oxide insulating film 21 is formed, for example, by deposition of MSQ (methyl silsesquioxane) in a thickness of 250 nm.

Next, thermal treatment is carried out. The thermal treatment is performed, for example, at a heating temperature of 300° C. for 60 minutes. This treatment permits manganese (Mn) diffused in the conductor 14 to be further diffused up to the surface portion of the conductor 14, and this manganese (Mn) reacts with silicon (Si) and oxygen (O) present in the silicon oxide insulating film 21, thereby forming a manganese silicate ($MnSi_xO_y$) thin film 22 of a high barrier property against copper. More particularly, the manganese silicate film 22 is formed selectively only on the conductor 14 serving as a copper wiring. It will be noted that owing to the thermal budget involved in the CVD film formation of the silicon oxide insulating film 21, the above-mentioned thermal treatment for forming the manganese silicate film that is a self-formed barrier film is not always essential but is preferred for enhancing a formation efficiency of the manganese silicate film 22.

In the manufacturing method of the semiconductor device, there is no need of forming a silicon nitride carbide (SiCN) insulating film having a dielectric constant of about 5 on wiring as having been formed in existing techniques, so that the capacitance could be reduced over the case of prior art, like the fifth embodiment relating to the manufacturing method. Moreover, because interface adhesion between the conductor 14 and the manganese silicate film 22 is improved, resistances to stress migration (SM), electro migration (EM) and the like are improved, thereby improving wiring reliability. In addition, because the manganese silicate film 22 is formed as being thick upon etching for the formation of a via hole in the insulating film, e.g. the silicon oxide insulating film 21, on a conductor (e.g. a wiring), a so called "break through" is suppressed, with the result that a variation of a via resistance could be reduced by 30%.

Because two manganese supply source layers such as the first and second seed films 77, 79, each made of a copper-manganese alloy, are formed plurally, the formation efficiency of the manganese silicate film 22 is enhanced. For instance, if a copper-manganese alloy layer is formed singly as being thick, there is the concern that a burying failure may occur in a subsequent burying step of the copper-based film. In other words, voids may occur, resulting in deterioration of wiring reliability.

In the manufacturing method of the semiconductor device, although a so-called single damascene structure has been illustrated, the method of the invention may be likewise applied to a dual damascene structure. For the materials constituting the conductor 14, not only copper-based films formed of copper, a copper alloy and the like, but also metals such as silver (Ag), gold (Au), aluminium (Al) and the like may be usable.

A method for manufacturing a semiconductor device according to an eighth embodiment of the invention is now described with reference to FIGS. 10A to 10C that are, respectively, a sectional view showing a manufacturing step.

Figure 10A:
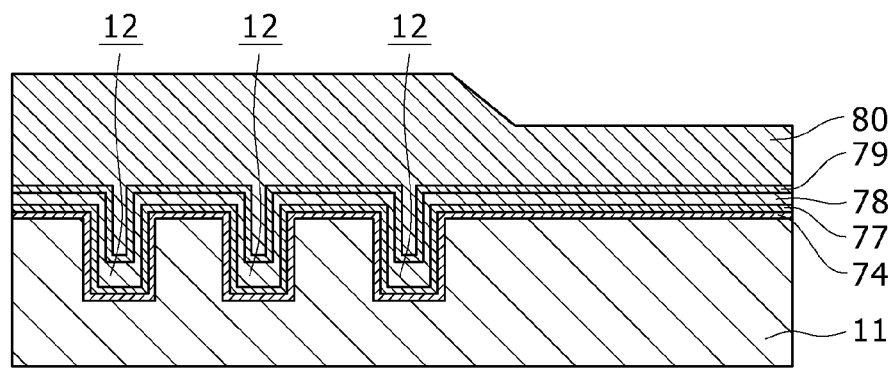
FIGS. 10A to 10C are schematic sectional views showing a method for manufacturing a semiconductor device according to an eighth embodiment of the invention.

As shown in FIG. 10A, an insulating film 11 made of a silicon oxide insulating film is formed on a semiconductor substrate (not shown), like the fifth embodiment illustrated with reference to FIGS. 5A to 5C. This insulating film is formed of an inorganic oxide film having a dielectric constant of 3 or below, e.g. a MSQ (methyl silsesquioxane) film, for example, by a chemical vapor deposition (CVD) method. The thickness is, for example, at 200 nm. Subsequently, a recess 12 (e.g. a wiring) is formed in the insulating film 11 by etching. For the etching, a carbon fluoride (CF) etching gas is used, for example, with the recess being formed at a depth, for example, of 150 nm.

Next, a barrier metal film 74 is formed on the inner surfaces of the recess 12 and the surface of the insulating film 11. This barrier metal film 74 is made, for example, of a tantalum (Ta) film, with its thickness being, for example, at 5 nm. Moreover, a first seed film 77 is formed. This first seed film 77 is made, for example, of a copper-manganese (CuMn) alloy film and its thickness is, for example, at 40 nm. This first seed film 77 can be formed by a thin film formation technique such as a sputtering method, an atomic layer deposition method or the like. Thereafter, a first copper-based film 78 is formed by an electrolytic plating (ECP) method or a CVD method. A copper film having a thickness, for example, of 50 nm is formed herein for the copper-based film.

Subsequently, a second seed film 79 is formed on the surface of the first copper-based film 78. This second seed film 79 is made, for example, of a copper-manganese (CuMn) alloy film with its thickness being, for example, at 10 nm. This second seed film 79 can be formed by a thin film formation technique such as a sputtering method, an atomic layer deposition method or the like. Thereafter, a second copper-based film 80 is formed by an electrolytic plating (ECP) method or a CVD method so as to bury the recess 12 therewith. A copper film is formed herein for the copper-based film. It will be noted that when the seed films 77, 79 and the copper-based films 78, 80 are appropriately adjusted in thickness, a multi-layered structure having layers larger in number than those mentioned above may be formed inside the recess 12.

Figure 10B:
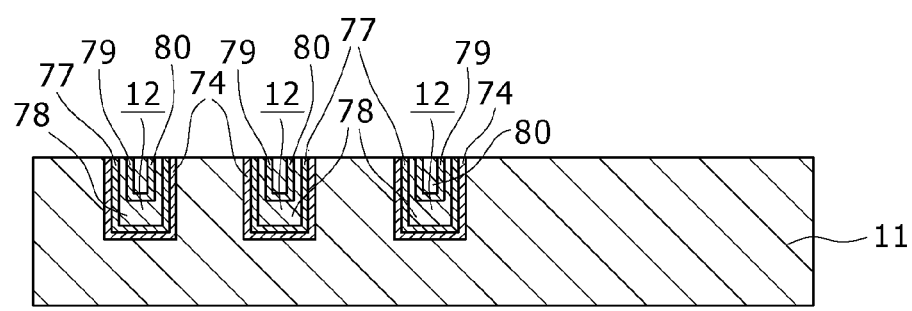

Next, as shown in FIG. 10B, the first and second copper-based films 78, 80 (see FIG. 10A), first and second seed films 77, 79 (see FIG. 10A) and barrier metal film 74 and the like, which are in excess on the surface of the insulating film 11, are polished to expose the surface of the insulating film 11 and to form a stacked structure of the first seed film 77, first copper-based film 78, second seed film 79 and second copper-based film 80 inside the recess 12 via the barrier metal film 74.

Figure 10C:
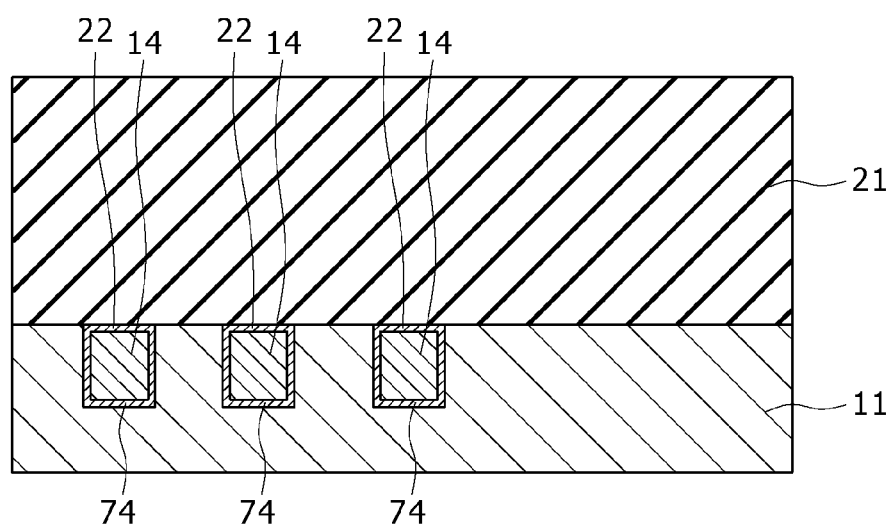

Next, as shown in FIG. 10C, a silicon oxide insulating film 21 is formed on the insulating film 11 so as to cover the stacked structure therewith. This silicon oxide insulating film 21 is formed by deposition, for example, of MSQ (methyl silsesquioxane) in a thickness of 250 nm.

Subsequently, thermal treatment is carried out. The thermal treatment is performed, for example, at a heating temperature of 300° C. for 60 minutes. This treatment permits manganese (Mn) present in the first and second seed films 77, 79 (see FIG. 10B) to be diffused up to copper portions of the first and second seed films 77, 79 and a surface portion of the conductor 14 made of the first and second copper-based films 78, 80 (see FIG. 10B), and this manganese (Mn) reacts with silicon (Si) and oxygen (O) present in the silicon oxide insulating film 21, thereby forming a manganese silicate (MnSi$_x$O$_y$) thin film 22 of a high barrier property against copper. More particularly, the manganese silicate film 22 is formed selectively only on the conductor 14 serving as a copper wiring. Thus, the conductor 14 is formed inside the recess 12 via the barrier metal film 74 and the manganese silicate film 22 is formed only on the upper surface of the conductor 14. It will be noted that owing to the thermal budget involved in the CVD film formation of the silicon oxide insulating film 21, the above-mentioned thermal treatment for forming the manganese silicate film that is a self-formed barrier film is not always essential but is preferred for enhancing a formation efficiency of the manganese silicate film 22.

In the manufacturing method of the semiconductor device, there is no need of forming a silicon nitride carbide (SiCN) insulating film having a dielectric constant of about 5 on wiring as having been formed in existing techniques, so that the capacitance could be reduced over the case of prior art, like the fifth embodiment relating to the manufacturing method. Moreover, because interface adhesion between the conductor 14 and the manganese silicate film 22 is improved, resistances to stress migration (SM), electro migration (EM) and the like are improved, thereby improving wiring reliability. In addition, because the manganese silicate film 22 is formed on a conductor (e.g. a wiring) as being thick upon etching for the formation of a via hole in the insulating film, e.g. the silicon oxide insulating film 21, a so called "break through" is suppressed, with the result that a variation of a via resistance could be reduced by 30%.

In the manufacturing method of the semiconductor device, although a so-called single damascene structure has been illustrated, the method of the invention may be likewise applied to a dual damascene structure. For the materials constituting the conductor 14, not only copper-based films formed of copper, a copper alloy and the like, but also metals such as silver (Ag), gold (Au), aluminium (Al) and the like may be usable.

Next, a method for manufacturing a semiconductor device according to a ninth embodiment of the invention is described with reference to FIGS. 11A to 11C that are, respectively, a sectional view showing a manufacturing step.

Figure 11A:
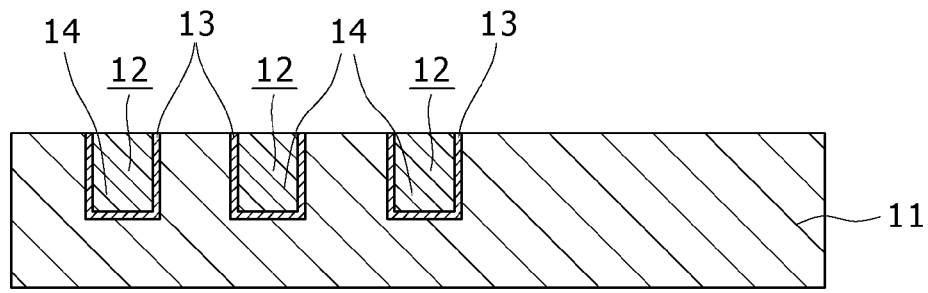
FIGS. 11A to 11C are schematic sectional views showing a method for manufacturing a semiconductor device according to a ninth embodiment of the invention.

As shown in FIG. 11A, an insulating film 11 made of a silicon oxide insulating film is formed on a semiconductor substrate (not shown), like the manufacturing method illustrated with reference to FIGS. 7A and 7B. This insulating film 11 is formed of an inorganic oxide film having a dielectric constant of 3 or below, e.g. a MSQ (methyl silsesquioxane) film, for example, by a chemical vapor deposition (CVD) method. The thickness is, for example, at 200 nm. Subsequently, a recess 12 (e.g. a wiring recess) is formed in the insulating film 11 by etching. For the etching, a carbon fluoride (CF) etching gas is used, for example, with the recess being formed at a depth, for example, of 150 nm. Next, a conductor (e.g. a wiring) made of a copper-based film is formed inside the recess 12 via a barrier metal film 13 made of a manganese silicate (MnSi$_x$O$_y$) film. For the formation of the manganese silicate film, manganese present in the seed film 75 (see FIG. 7B) made of a copper-manganese alloy is not consumed to a full extent, and is left therein. This manganese is diffused into the conductor 14.

Figure 11B:
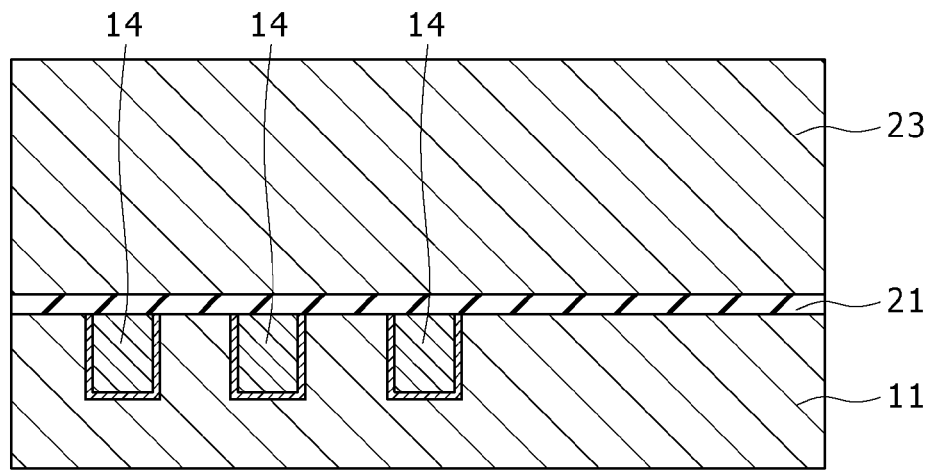

Next, as shown in FIG. 11B, a silicon oxide insulating film 21 is formed on the insulating film 11 so as to cover the conductor 14 therewith. This silicon oxide insulating film 21 is formed by deposition, for example, of MSQ (methyl silsesquioxane) in a thickness of 10 nm. Moreover an organic insulating film 23 is formed on the silicon oxide insulating film 21. This organic insulating film 23 is formed, for example, of a polyaryl ether film in a thickness, for example, of 240 nm.

Figure 11C:
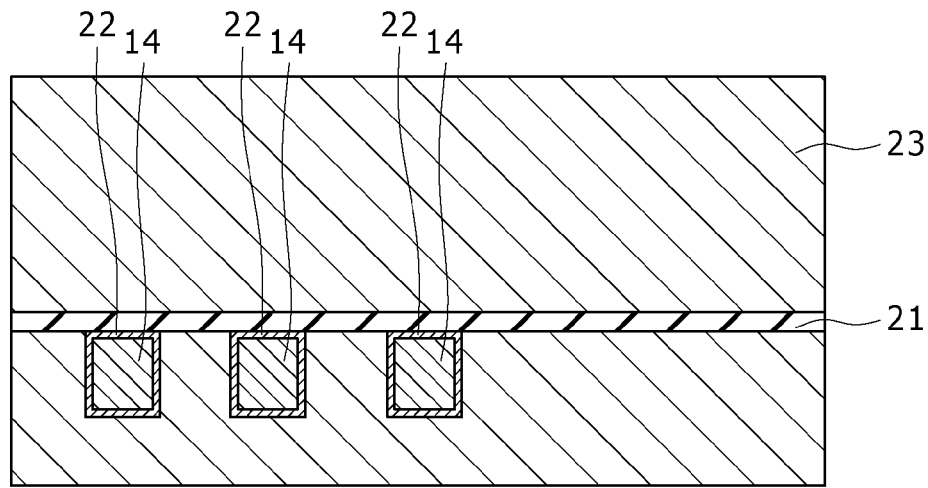

Next, as shown in FIG. 11C, thermal treatment (curing) is carried out. This thermal treatment is performed, for example, at a heating temperature of 350° C. for 30 minutes. According to this treatment, the manganese (Mn) diffused in the conductor 14 is diffused to the surface portion of the conductor 14, and this manganese (Mn) reacts with silicon (Si) and oxygen (O) in the silicon oxide insulating film 21 to form a manganese silicate (MnSi$_x$O$_y$) thin film 22 of a high barrier property against copper. More particularly, the manganese silicate film 22 is formed selectively only on the conductor 14 serving as a copper-based wiring.

In the manufacturing method of the semiconductor device, there is no need of forming a silicon nitride carbide (SiCN)

insulating film having a dielectric constant of about 5 on wiring as having been formed in existing techniques, so that the capacitance could be reduced over the case of prior art, like the fifth embodiment relating to the manufacturing method. Moreover, because an interface adhesion between the conductor 14 and the manganese silicate film 22 is improved, resistances to stress migration (SM), electro migration (EM) and the like are improved, thereby improving wiring reliability. In addition, the process of forming the organic insulating film 23 can be applied, with an advantage in that a range of choice in type of interlayer insulating film is expanded.

In the manufacturing method of the semiconductor device, although a so-called single damascene structure has been illustrated, the method of the invention may be likewise applied to a dual damascene structure. For the materials constituting the conductor 14, not only copper-based films formed of copper, a copper alloy and the like, but also metals such as silver (Ag), gold (Au), aluminium (Al) and the like may be usable.

Next, a method for manufacturing a semiconductor device according to a tenth embodiment of the invention is described with reference to FIGS. 12A to 15B that are, respectively, a sectional view showing a manufacturing step.

Figure 12A:
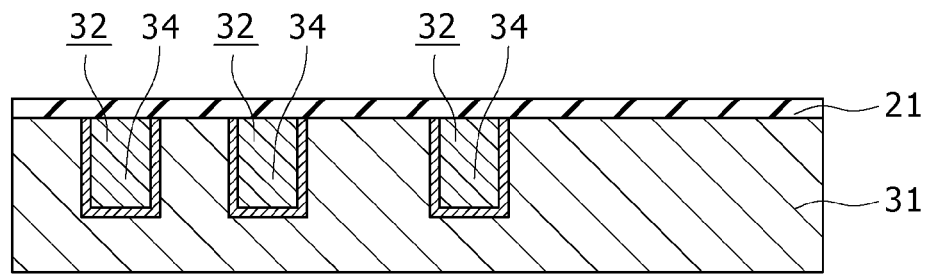
FIGS. 12A to 12D are schematic sectional views showing a method for manufacturing a semiconductor device according to a tenth embodiment of the invention.

As shown in FIG. 12A, an insulating film 31 made of a silicon oxide insulating film is formed on a semiconductor substrate (not shown) in the same manner as in the ninth embodiment illustrated with respect to FIGS. 11A to 11C. This insulating film 31 is formed of an inorganic oxide film having a dielectric constant of 3 or below, e.g. a MSQ (methyl silsesquioxane) film, for example, by a chemical vapor deposition (CVD) method. The thickness is, for example, at 200 nm. Subsequently, a recess 32 (e.g. a wiring recess) is formed in the insulating film 31 by etching. For the etching, a carbon fluoride (CF) etching gas is used, for example, with the recess being formed at a depth, for example, of 150 nm. Next, a conductor 34 (hereinafter referred to as a first wiring) made of a copper-based film is formed inside the recess 32 via a barrier metal film 33 made of a manganese silicate ($MnSi_xO_y$) film. For the formation of the manganese silicate film, a seed film (not shown) made of a copper-manganese alloy is formed, and manganese present in the seed film is not consumed to a full extent and is left therein. This manganese is diffused into the conductor 34.

Next, a silicon oxide insulating film 21 is formed on the insulating film 31 so as to cover the conductor 34 therewith. This silicon oxide insulating film 21 is formed by deposition, for example, of MSQ (methyl silsesquioxane) in a thickness of 10 nm.

Figure 12B:
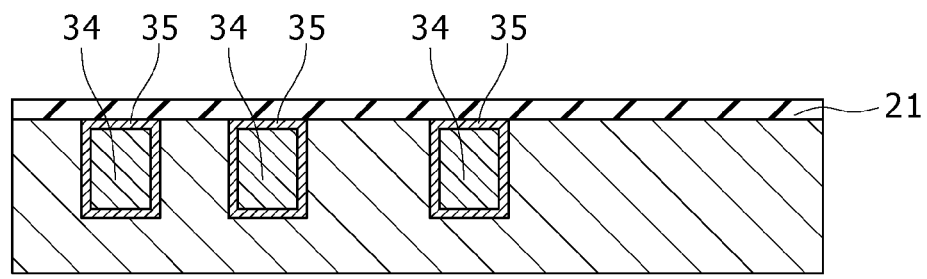

As shown in FIG. 12B, thermal treatment is carried out. This thermal treatment is performed, for example, at a heating temperature of 300° C. for 30 minutes. According to this treatment, the manganese (Mn) diffused in the first wiring 34 is diffused to the surface portion of the first wiring 34, and this manganese (Mn) reacts with silicon (Si) and oxygen (O) in the silicon oxide insulating film 21 to form a manganese silicate ($MnSi_xO_y$) thin film 35 of a high barrier property against copper. More particularly, the manganese silicate film 35 is formed selectively only on the first wiring 34.

Figure 12C:
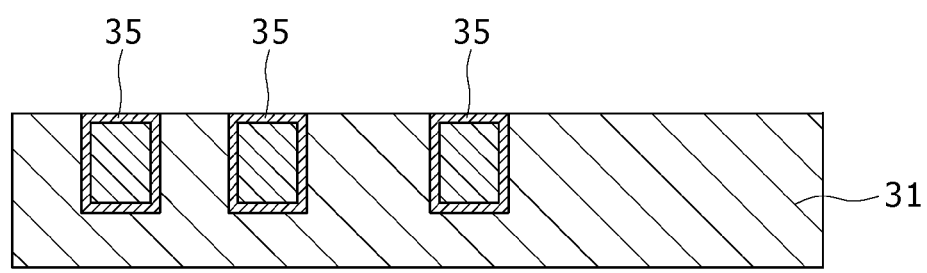

As shown in FIG. 12C, the silicon oxide insulating film 21 (see FIG. 12B) on the first insulating film 31 is removed. This removing step is carried out until the manganese silicate film 35 is exposed. For this, wet etching or dry etching is used.

Figure 12D:
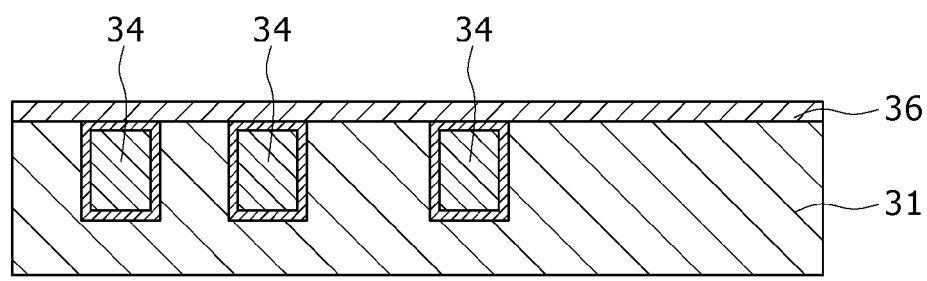

Next, as shown in FIG. 12D, a barrier film 36 is formed on the first insulating film 31 to cover the first wiring 34. This barrier film 36 is formed, for example, of a silicon nitride carbide (SiCN) film in a thickness, for example, of 30 nm. The barrier film is formed, for example, by CVD.

Figure 13A:
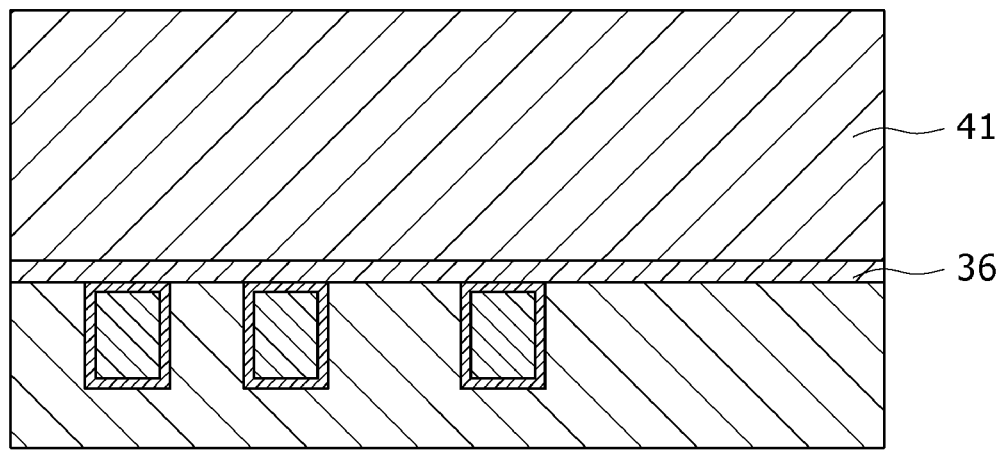
FIGS. 13A and 13B are schematic sectional views showing a method for manufacturing a semiconductor device according to a tenth embodiment of the invention.

As shown in FIG. 13A, a second insulating film 41 is formed on the barrier film 36. The second insulating film 41 is formed, for example, by deposition of MSQ (methyl silsesquioxane) in a thickness of 250 nm.

Figure 13B:
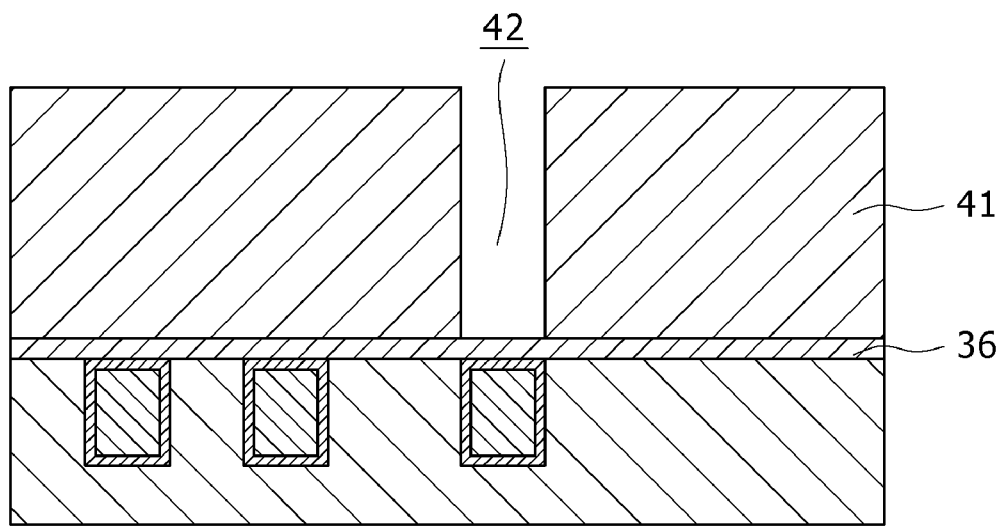

Thereafter, as shown in FIG. 13B, an etching mask (not shown) for forming a via hole is formed on the second insulating film 41 using, for example, a chemically amplified ArF resist. Subsequently, the second insulating film 41 is etched to form a via hole 42. Since the barrier film 36 made of silicon nitride carbide is formed at the bottom of the via hole 42, it is possible to ensure high selectivity upon the etching, thus enabling robust processing.

Figure 14A:
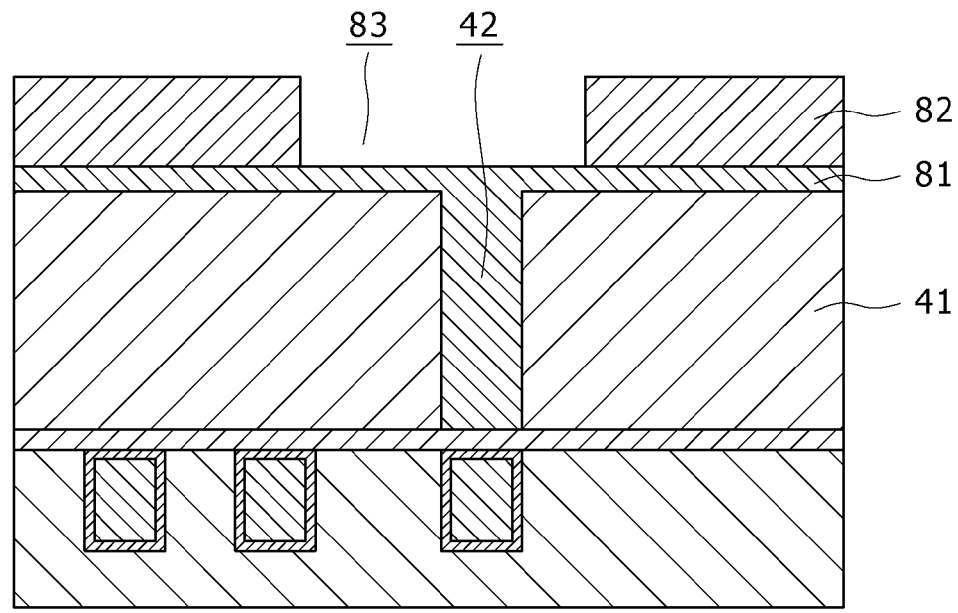
FIGS. 14A and 14B are schematic sectional views showing a method for manufacturing a semiconductor device according to a tenth embodiment of the invention.

Next, as shown in FIG. 14A, an organic antireflective film (BARC: bottom antireflective film) 81 is coated on the second insulating film 41 to bury the via hole therewith, followed by forming an etching mask 82, e.g. a chemically amplified ArF resist, to form a wiring recess. This etching mask 82 is formed with a wiring recess pattern 83.

Figure 14B:
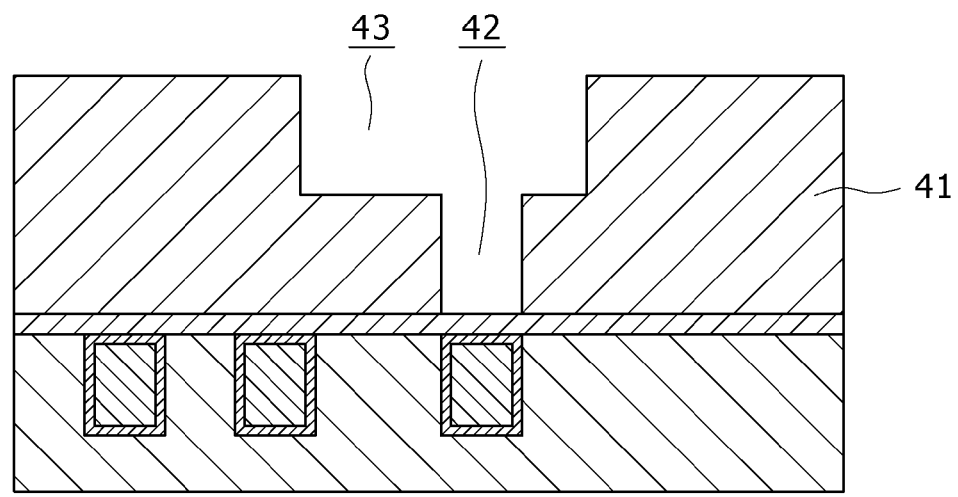

As shown in FIG. 14B, the organic antireflective film 81 (see FIG. 14A) and the second insulating film 41 are, respectively, etched to form a wiring recess 43. The via hole 42 is formed at the bottom of the wiring recess 43. Thereafter, the etching mask 81 and the organic antireflective film 82 (see FIG. 14A) are both removed.

Figure 15A:
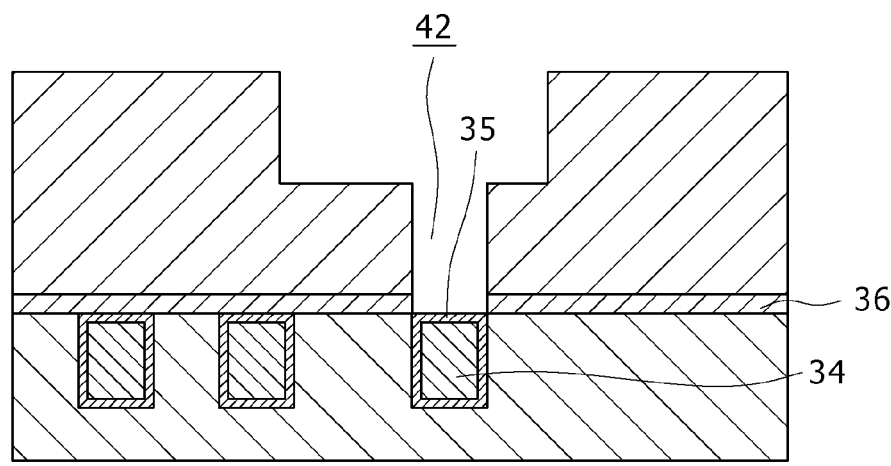
FIGS. 15A and 15B are schematic sectional views showing a method for manufacturing a semiconductor device according to a tenth embodiment of the invention.

Next, as shown in FIG. 15A, the barrier film 36 formed at the bottom of the via hole 42 is removed to connect the via hole 42 with the first wiring 34 via the manganese silicate film 35. For the etching, a carbon fluoride (CF) etching gas is used.

Figure 15B:
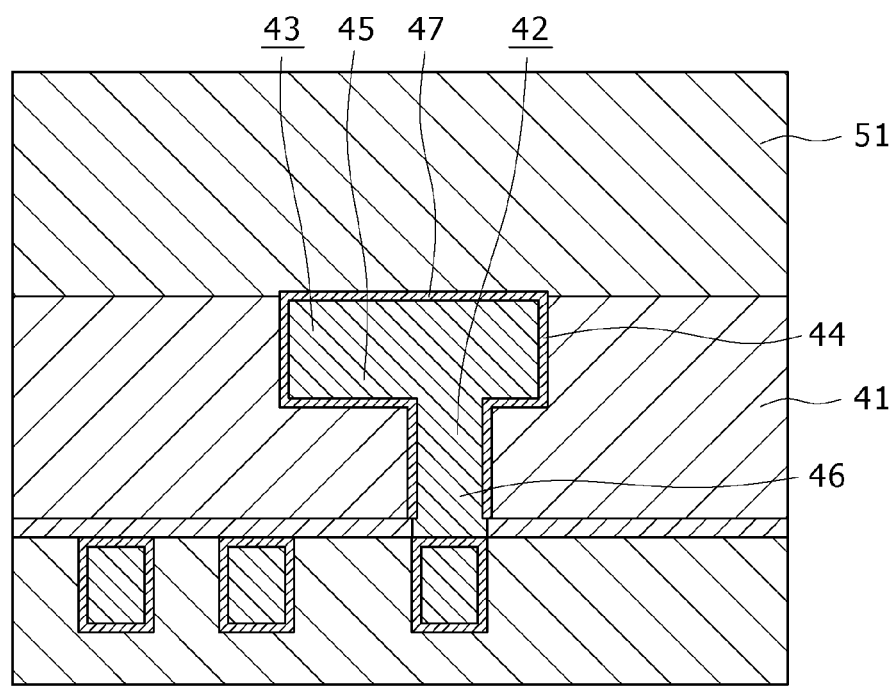

As shown in FIG. 15B, a seed film (not shown) made, for example, of a copper-manganese (CuMn) alloy film is formed on the inner surfaces of the wiring recess 43, the inner surfaces of the via hole 42 and the surface of the second insulating film 41 in a thickness, for example, of 40 nm. According to an electrolytic plating (EPC) method of a CVD method, a copper-based film is formed to bury the wiring recess 43 and the via hole 42. Thereafter, thermal treatment is carried out. The thermal treatment is performed, for example, under conditions of a heating temperature of 300° C. for 60 minutes. This treatment permits the grain growth of copper in the copper-based film to be promoted and the reaction between the manganese (Mn) in the seed film and the silicon (Si) and oxygen (O) in the second insulating film 41 made of a silicon oxide insulating film, thereby forming a barrier film 44 made of a manganese silicate ($MnSi_xO_y$) film of a high barrier property against copper. In this way, the barrier film 44 is self-formed on the side walls and bottom surface of the wiring recess 43 and also on the side walls of the via hole 42.

Thereafter, the copper-based film, the seed film and the like that are in excess on the surface of the second insulating film are removed by a chemical mechanical polishing (CMP) method to expose the second insulating film 41, and conductors (a second wiring 45 and a connection plug 46), each made of a copper-based film, are formed inside the wiring recess 43 and the via hole 42 through the barrier film 44 made of a manganese silicate film, respectively. For the formation of the manganese silicate film, manganese in the seed film made of a copper-manganese alloy is not consumed to a full extent, and manganese is left therein. The left manganese is diffused into the conductors (the second wiring 45 and connection plug 46), respectively.

Next, a third insulating film 51 made of a silicon oxide insulating film is formed on the second insulating film 41 so as to cover the conductor (the second wiring 45). This silicon oxide insulating film is formed by deposition, for example, of MSQ (methyl silsesquioxane) in a thickness of 250 nm.

Thereafter, thermal treatment is carried out. This thermal treatment is performed, for example, at a heating temperature of 300° C. for 60 minutes. According to the treatment, the manganese diffused into the conductors (i.e. the second wiring 45 and the connection plug 46) is diffused up to the surface portion of the second wiring 45 and reacts with silicon (Si) and oxygen (O) present in the third insulating film 51 made of a silicon oxide insulating film thereby forming a manganese silicate ($MnSi_xO_y$) film 47 of a high copper barrier property against copper. More particularly, the manganese silicate film 47 is formed selectively only on the second wiring 45. It will be noted that owing to the thermal budget involved in the CVD film formation of the silicon oxide insulating film, the manganese silicate film serving as a barrier film is self-formed, so that the thermal treatment is not always essential, but is preferred in order to enhance the formation efficiency of the manganese silicate film 47.

According to the manufacturing method of the semiconductor device, although the capacitance is at the same level as in prior art, interface adhesion is improved, thus leading to improved reliability of stress migration (SM) and electro migration (EM). In addition, the barrier film 36 made of silicon nitride carbide exhibits high selectivity at the time of etching of the via hole, ensuring robust processing of the via hole. Accordingly, breakthrough upon the processing of the via hole is suppressed, with the attendant advantage that a variation in via resistance can be reduced by 50%.

Next, a method for manufacturing a semiconductor device according to an eleventh embodiment of the invention is illustrated with reference to FIGS. 16A to 18B that are, respectively, a schematic sectional view showing a manufacturing step.

Figure 16A:
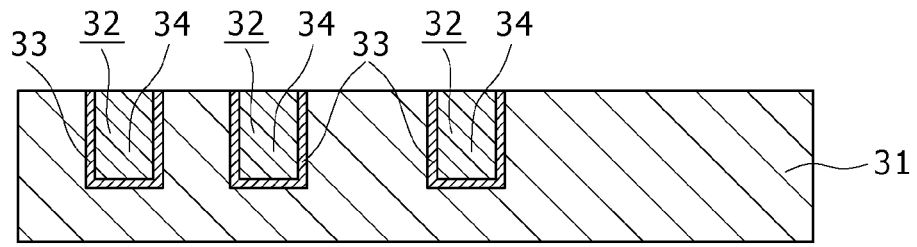
FIGS. 16A to 16D are schematic sectional views showing a method for manufacturing a semiconductor device according to an eleventh embodiment of the invention.

As shown in FIG. 16A, like the sixth embodiment, a first insulating film 31 made of a silicon oxide insulating film is formed on a semiconductor substrate (not shown). This first insulating film 31 is formed of an inorganic oxide film having a dielectric constant of 3 or below, e.g. a MSQ (methyl silsesquioxane) film, for example, by a chemical vapor deposition (CVD) method. The thickness is, for example, at 200 nm. Subsequently, a recess 32 (e.g. hereinafter referred to as a wiring recess) is formed in the insulating film 31 by etching. For the etching, a carbon fluoride (CF) etching gas is used, for example, and the recess 32 is formed at a depth, for example, of 150 nm. Next, a conductor 34 (hereinafter referred to as a first wiring) made of a copper-based film is formed inside recess 32 via a barrier metal film 33 made of a manganese silicate ($MnSi_xO_y$) film. For the formation of the manganese silicate film, a seed film (not shown) made of a copper-manganese alloy is formed, and manganese present in the seed film is not consumed to a full extent and is left therein. This manganese is diffused in the first wiring 34.

Figure 16B:
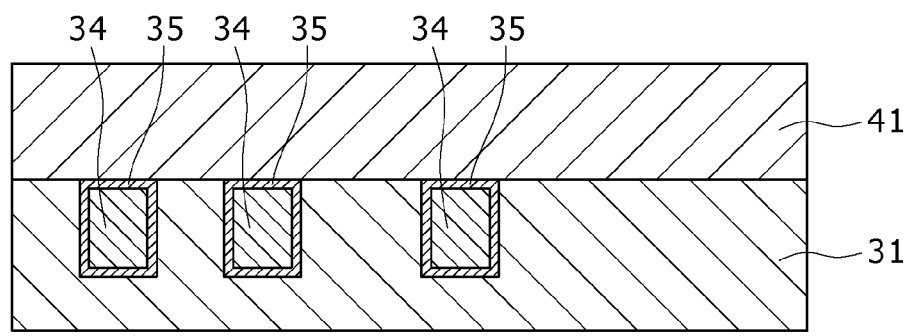

Next, as shown in FIG. 16B, a second insulating film 41 made of a silicon oxide insulating film is formed on the first insulating film 31 so as to cover the first wiring 34 therewith. This silicon oxide insulating film is formed by deposition, for example, of MSQ (methyl silsesquioxane) in a thickness of 100 nm.

Thereafter, thermal treatment is carried out. This thermal treatment is performed, for example, at a heating temperature of 300° C. for 30 minutes. According to this treatment, the manganese (Mn) diffused in the first wiring 34 is diffused up to the surface portion of the first wiring 34, and this manganese (Mn) reacts with silicon (Si) and oxygen (O) in the second silicon oxide insulating film 41 to form a manganese silicate ($MnSi_xO_y$) thin film 35 of a high barrier property against copper. More particularly, the manganese silicate film 35 is formed selectively only on the first wiring 34.

Figure 16C:
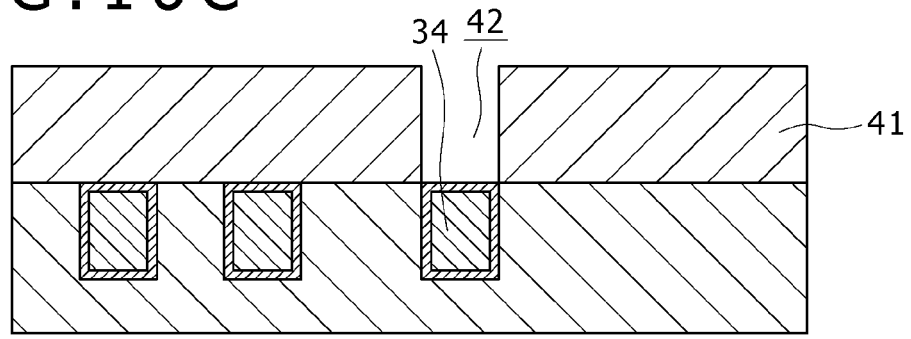

Next, as shown in FIG. 16C, an etching mask (not shown) for forming a via hole is formed on the second insulating film 41, for example, by the use of a chemically amplified ArF resist. Next, the second insulating film 41 is etched to form a recess 42 (hereinafter referred to as via hole).

Figure 16D:
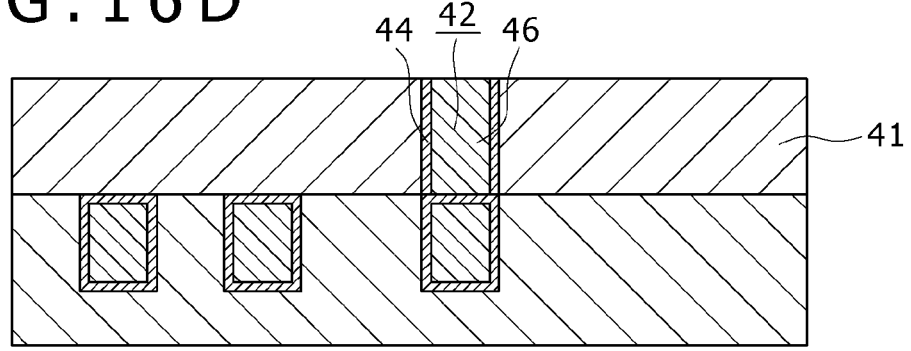

Thereafter, as shown in FIG. 16D, a seed film (not shown) is formed on the inner surfaces of the via hole 42 and the surface of the second insulating film 41 made of the silicon oxide insulating film. This seed film can be formed by a thin film formation technique such as a sputtering method, an atomic layer deposition method or the like. Moreover, a copper-based film (not shown) is formed by an electrolytic plating (EPC) method or a CVD method to bury the via hole 42. For the bopper-based film, a copper film is used herein and formed by an electrolytic (EPC) method or a CVD method.

Next, thermal treatment is carried out. The thermal treatment is performed, for example, at a heating temperature of 300° C. for 60 minutes. According to this treatment, grain growth of copper in the copper-based film is promoted, and the manganese (Mn) in the seed film reacts with silicon (Si) and oxygen (O) present in the insulating film 41 made of the silicon oxide insulating film are reacted to form a barrier film 44 made of a manganese silicate ($MnSi_xO_y$) thin film of a high barrier property against copper. In this way, the barrier film 44 is formed, by so-called self-forming, at the side walls of the via hole 42.

Subsequently, the copper-based film, seed film and the like that are in excess on the surface of the second insulating film 41 are polished by a chemical mechanical polishing (CMP) method to expose the surface of the second insulating film 41 and also to from a conductor 46 (hereinafter referred to as connection plug) made of a copper-based film in the via hole 42 through a barrier film 44 made of manganese silicate. For the formation of the manganese silicate film, manganese present in the seed film made of a copper-manganese alloy is not consumed to a full extent and manganese is left therein. This manganese is diffused into the connection plug 46.

Figure 17A:
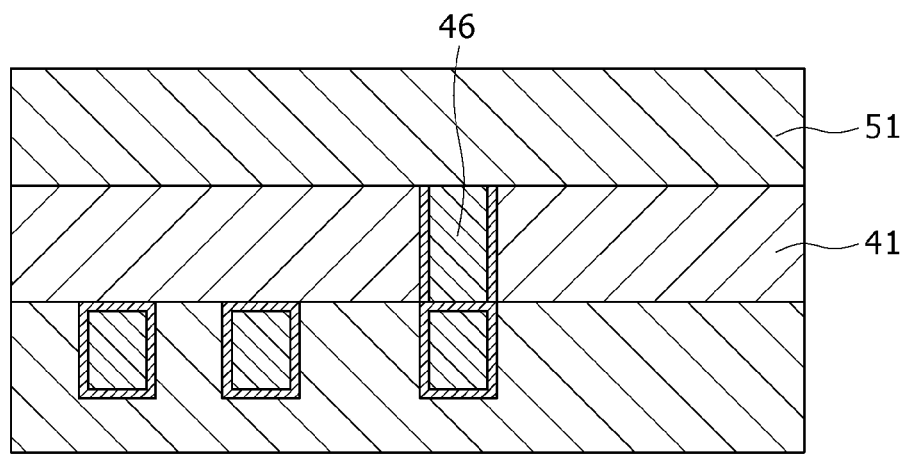
FIGS. 17A and 17B are schematic sectional views showing a method for manufacturing a semiconductor device according to an eleventh embodiment of the invention.

As shown in FIG. 17A, a third insulating film 51 made of a silicon oxide insulating film is formed on the second insulating film 41 so as to cover the connection plug 46. The silicon oxide insulating film is formed, for example, by deposition of MSQ (methyl silsesquioxane) in a thickness of 150 nm.

Figure 17B:
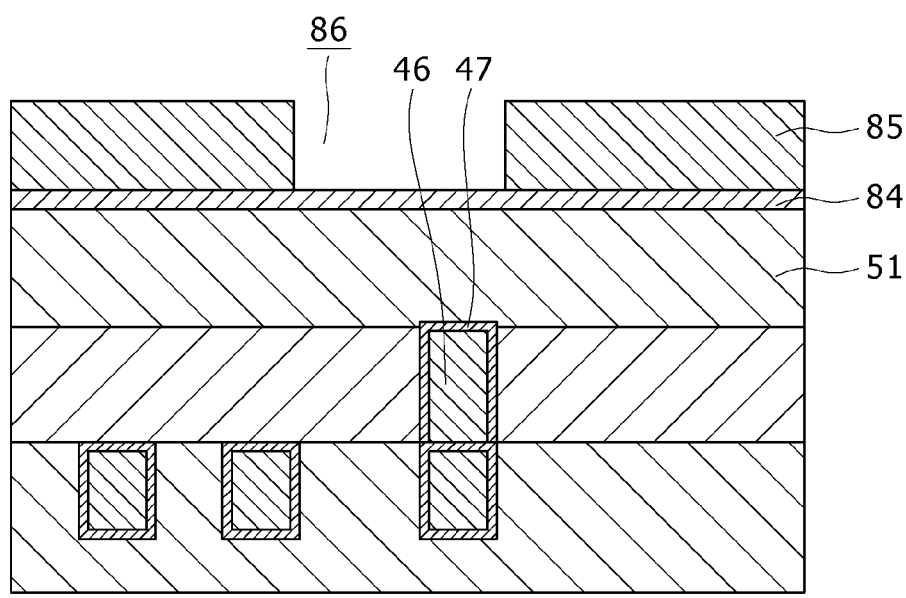

Next, as shown in FIG. 17B, thermal treatment is carried out. The thermal treatment is performed, for example, at a heating temperature of 300° C. for 60 minutes. According to this treatment, manganese (Mn) present in the connection plug 46 is diffused up to the surface portion of the connection plug 46, and this manganese (Mn) reacts with silicon (Si) and oxygen (O) present in the third insulating film 51 made of the silicon oxide insulating film to form a barrier film 47 made of a manganese silicate ($MnSi_xO_y$) thin film of a high barrier property against copper. More particularly, the manganese silicate film 47 is formed selectively only on the connection plug 46.

Next, after formation of an organic anti-reflective film 84 (BARC: bottom antireflective coat) on the third insulating film 51 by coating, an etching mask 85 for forming a wiring recess is formed, for example, by use of a chemically amplified ArF resist. The etching mask 85 is formed with a wiring recess pattern 86 therein.

Figure 18A:
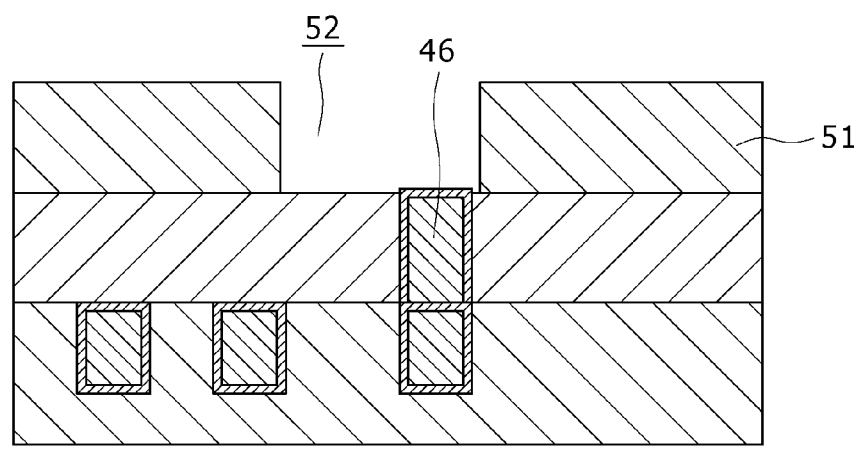
FIGS. 18A and 18B schematic sectional views showing a method for manufacturing a semiconductor device according to an eleventh embodiment of the invention.
Figure 18B:
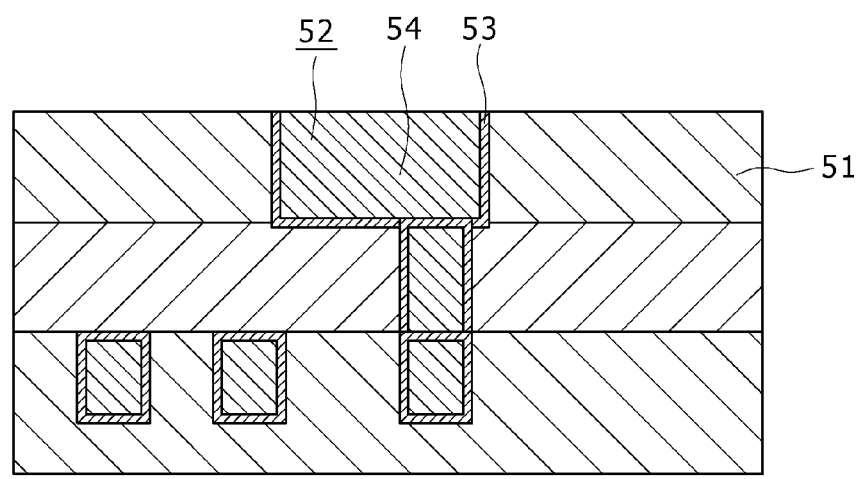

Thereafter, as shown in FIG. 18A, the organic antireflective film 84 (see FIG. 17B) and the third insulating film 51 are etched to form a recess 52 (hereinafter referred to as wiring recess). The wiring recess 52 is formed with the connection plug 46 at the bottom thereof. Subsequently, the etching mask 85 and the organic antireflective film 84 (see FIG. 17B) are removed.

Next, as shown in FIG. 18A, a seed film (not shown) is formed on the inner surface of the wiring recess 52 and the surface of the third insulating film 51. This seed film is made, for example, of a copper-manganese (CuMn) alloy film and is formed in a depth, for example, of 40 nm. This seed film can be formed by a thin film formation technique such as a sputtering method, an atomic layer deposition method or the like. Moreover, a copper-based film (not shown) is formed by an electrolytic plating (EPC) method or a CVD method to bury the wiring recess 52. For the bopper-based film, a copper film is used herein and formed by an electrolytic (EPC) method or a CVD method.

Next, thermal treatment is carried out. The thermal treatment is performed, for example, at a heating temperature of 300° C. for 60 minutes. According to this treatment, grain growth of copper in the copper-based film is promoted, and the manganese (Mn) in the seed film reacts with silicon (Si) and oxygen (O) present in the third insulating film 51 made of the silicon oxide insulating film to form a barrier film 53 made of a manganese silicate ($MnSi_xO_y$) thin film of a high barrier property against copper. In this way, the barrier film 53 is self-formed at the side walls and bottom surface of the wiring recess 52 in contact with the silicon oxide insulating film.

Next, the copper-based film, seed film and the like that are in excess on the third insulating film 51 are polished by a chemical mechanical polishing (CMP) method to expose the surface of the third insulating film 51 and also to form a conductor 54 (hereinafter referred to as second wiring) made of a copper-based film inside the wiring recess 52 through a barrier film 53 made of manganese silicate. For the formation of the manganese silicate film, manganese present in the seed film made of a copper-manganese alloy is not consumed to a full extent but is left therein. This manganese is diffused in the second wiring 54.

Figure 19:
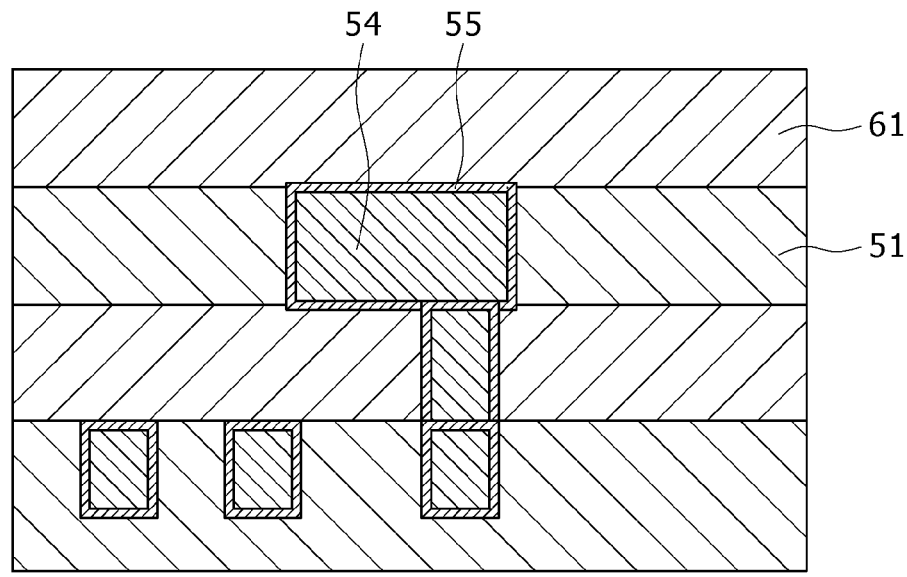
FIG. 19 is a schematic sectional views showing a method for manufacturing a semiconductor device according to an eleventh embodiment of the invention.
Figure 20:
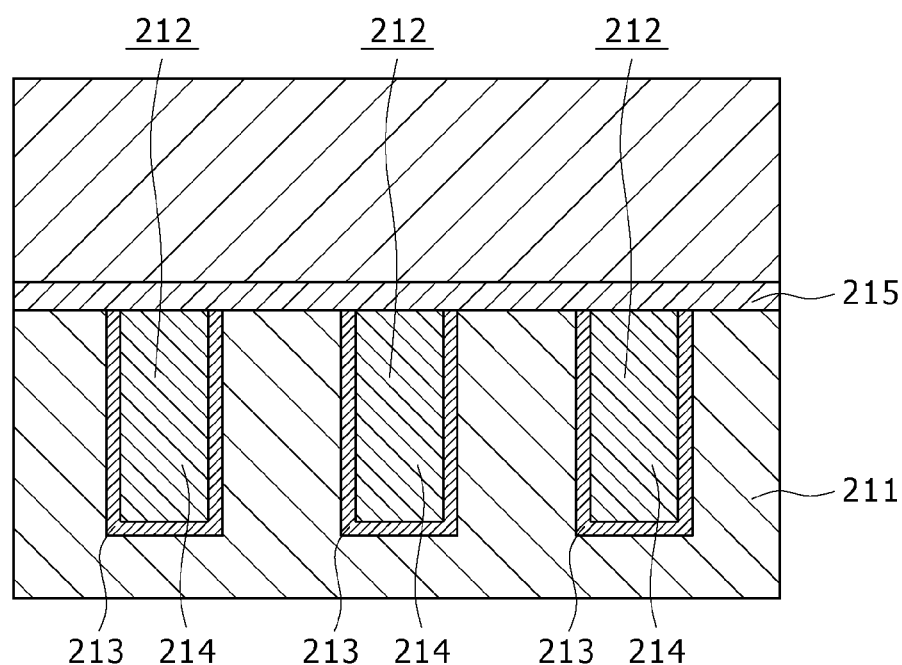
FIG. 20 is a schematic sectional view showing an instance of a semiconductor device according to a prior art technique.

Next, as shown in FIG. 19, a manganese silicate film is formed on the upper surface of the second wiring 54 according to any of the methods illustrated in the foregoing embodiments. For instance, a fourth insulating film 61 made of a silicon oxide insulating film is formed on the third insulating film 51 so as to cover the second wiring 54. This silicon oxide insulating film is formed, for example, by deposition of MSQ (methyl silsesquioxane9 in a thickness of 150 nm.

Thereafter, thermal treatment is carried out. This thermal treatment is performed, for example, at a heating temperature of 300° C. for 60 minutes. According to this treatment, the manganese (Mn) diffused in the second wiring 54 is diffused to the surface portion of the second wiring 54, and this manganese (Mn) reacts with silicon (Si) and oxygen (O) in the fourth insulating film 61 made of a silicon oxide insulating film above the second wiring 54 to form a manganese silicate ($MnSi_xO_y$) thin film 55 of a high barrier property against copper. That is, the manganese silicate film 55 is formed selectively only on the second wiring 54.

In the manufacturing method of the semiconductor device, since no silicon nitride carbide (SiCN) insulating film having a dielectric constant of about 5, which has been formed in existing techniques, is formed, the capacitance can be reduced over prior-art techniques, like the foregoing fifth embodiment. Interface adhesion between the first wiring and manganese silicate film 35, interface adhesion between the connection plug 46 and the manganese silicate 47 and interface adhesion between the second wiring 54 and the manganese silicate film 55 are, respectively, improved. Additionally, the first wiring 35 connection plug 47 and second wiring 55 are each in an enfolded condition, so that resistances to stress migration (SM), electro migration (EM) and the like are improved, thereby improving wiring reliability.

What is claimed is:

1. A semiconductor device comprising:
an insulating film having a recess therein;
an electric conductor formed inside the recess;
a silicon oxide insulating film on the insulating film and the electric conductor;
a barrier film composed of manganese silicate provided at an interface between an inner surface of said recess and said conductor; and
a manganese silicate film formed directly on top of an upper surface of said electric conductor between said electric conductor and said silicon oxide insulating film, wherein,
said electric conductor includes manganese,
said barrier film provided at an interface between the inner surface of said recess and said conductor is contiguous to said manganese silicate film formed on the upper surface of said conductor, and
said manganese silicate film is a product of a reaction between the manganese in said electric conductor and said silicon oxide insulating film.

* * * * *